US006872607B2

(12) United States Patent
Tanaka

(10) Patent No.: US 6,872,607 B2
(45) Date of Patent: Mar. 29, 2005

(54) METHOD OF MANUFACTURING A SEMICONDUCTOR DEVICE

(75) Inventor: Koichiro Tanaka, Kanagawa (JP)

(73) Assignee: Semiconductor Energy Laboratory Co., Ltd. (JP)

(*) Notice: Subject to any disclaimer, the term of this patent is extended or adjusted under 35 U.S.C. 154(b) by 0 days.

(21) Appl. No.: 09/812,529

(22) Filed: Mar. 20, 2001

(65) Prior Publication Data

US 2001/0026835 A1 Oct. 4, 2001

(30) Foreign Application Priority Data

Mar. 21, 2000 (JP) ........................................ 2000-079159

(51) Int. Cl.[7] .......................... H01L 21/00; H01L 21/84
(52) U.S. Cl. ...................................... 438/166; 438/479
(58) Field of Search ................................. 438/166, 479

(56) References Cited

U.S. PATENT DOCUMENTS

| | | | | |
|---|---|---|---|---|
| 4,330,363 A | 5/1982 | Biegesen et al. | ............ | 156/620 |
| 4,466,179 A | 8/1984 | Kasten | ......................... | 29/576 |
| 4,915,772 A | 4/1990 | Fehlner et al. | .............. | 156/620 |
| 5,145,808 A | 9/1992 | Sameshima et al. | ......... | 437/173 |
| 5,194,853 A | 3/1993 | Asada | ......................... | 340/784 |
| 5,247,190 A | 9/1993 | Friend et al. | .................. | 257/40 |

(List continued on next page.)

FOREIGN PATENT DOCUMENTS

| | | |
|---|---|---|
| EP | 0 091 806 | 10/1983 |
| JP | 58-127318 | 7/1983 |
| JP | 59-161014 | 9/1984 |
| JP | 02-042717 | 2/1990 |
| JP | 03-280531 | 12/1991 |
| JP | 04-242724 | 8/1992 |
| JP | 04-282869 | 10/1992 |
| JP | 05-040278 | 2/1993 |
| JP | 05-175235 | 7/1993 |
| JP | 05-203977 | 8/1993 |
| JP | 05-211167 | 8/1993 |
| JP | 05-251342 | 9/1993 |
| JP | 06-045272 | 2/1994 |
| JP | 06-059278 | 3/1994 |
| JP | 06-260502 | 9/1994 |
| JP | 7-130652 | 5/1995 |
| JP | 07-307304 | 11/1995 |
| JP | 10-092576 | 4/1998 |
| WO | WO 90/13148 | 11/1990 |

OTHER PUBLICATIONS

Schenk, H. et al, "Polymers for Light Emitting Diodes," EURODISPLAY '99, Proceedings of the 19th International Display Research Conference, Sep. 6–9, 1999, Berlin, Germany, pp. 33–37.

English abstract re Japanese Patent Application No. JP 7–130652, published May 19, 1995.

(List continued on next page.)

*Primary Examiner*—Richard Booth
(74) *Attorney, Agent, or Firm*—Cook, Alex, McFarron, Manzo, Cummings & Mehler, Ltd.

(57) ABSTRACT

By using lasers having different wavelengths in laser annealing of an amorphous semiconductor film, the amorphous semiconductor film can be crystallized and the crystallinity of the crystallized film is improved. A laser 126 to 370 nm in wavelength is used first to subject an amorphous semiconductor film to laser annealing, thereby obtaining a crystalline semiconductor film. In desirable laser annealing, a subject surface is irradiated with a laser beam processed by an optical system into a linear laser beam that is linear in section on the subject surface. Next, a laser 370 to 650 nm in wavelength is used to irradiate the above crystalline semiconductor film by again processing the laser beam into a linear beam through an optical system. A crystalline semiconductor film thus obtained has an excellent crystallinity. If this crystalline semiconductor film is used to form an active layer of a TFT, an electric characteristic of the TFT can be improved.

26 Claims, 23 Drawing Sheets

U.S. PATENT DOCUMENTS

| | | | |
|---|---|---|---|
| 5,247,375 A | 9/1993 | Mochizuki et al. ............ 359/54 |
| 5,264,383 A | 11/1993 | Young ......................... 437/40 |
| 5,365,080 A * | 11/1994 | Yamazaki et al. ............ 257/66 |
| 5,365,875 A | 11/1994 | Asai et al. ..................... 117/7 |
| 5,372,836 A | 12/1994 | Imahashi et al. .............. 427/8 |
| 5,399,502 A | 3/1995 | Friend et al. .................. 437/1 |
| 5,403,762 A | 4/1995 | Takemura .................... 437/40 |
| 5,403,772 A | 4/1995 | Zhang et al. ............... 437/101 |
| 5,413,958 A | 5/1995 | Imahashi et al. ........... 437/173 |
| 5,414,442 A | 5/1995 | Yamazaki et al. ............ 345/89 |
| 5,432,122 A | 7/1995 | Chae .......................... 437/101 |
| 5,449,637 A | 9/1995 | Saito et al. .................... 437/57 |
| 5,453,858 A | 9/1995 | Yamazaki .................... 359/59 |
| 5,477,073 A | 12/1995 | Wakai et al. ............... 257/347 |
| 5,514,879 A | 5/1996 | Yamazaki .................... 257/65 |
| 5,529,630 A | 6/1996 | Imahashi et al. ........... 118/665 |
| 5,529,937 A | 6/1996 | Zhang et al. ................. 437/10 |
| 5,561,081 A | 10/1996 | Takenouchi et al. ........ 437/174 |
| 5,563,426 A | 10/1996 | Zhang et al. ................. 257/66 |
| 5,565,377 A | 10/1996 | Weiner et al. .............. 437/173 |
| 5,570,105 A | 10/1996 | Koyama ...................... 345/98 |
| 5,589,406 A * | 12/1996 | Kato et al. .................. 438/164 |
| 5,614,732 A | 3/1997 | Yamazaki .................... 257/66 |
| 5,627,084 A * | 5/1997 | Yamazaki et al. |
| 5,643,826 A | 7/1997 | Ohtani et al. ................. 437/88 |
| 5,680,147 A | 10/1997 | Yamazaki et al. ............ 345/94 |
| 5,701,167 A | 12/1997 | Yamazaki .................... 349/42 |
| 5,708,252 A | 1/1998 | Shinohara et al. ..... 219/121.73 |
| 5,767,930 A | 6/1998 | Kobayashi et al. ........... 349/42 |
| 5,789,762 A | 8/1998 | Koyama et al. |
| 5,795,795 A | 8/1998 | Kousai et al. |
| 5,808,318 A * | 9/1998 | Masumo et al. .............. 257/66 |
| 5,849,601 A | 12/1998 | Yamazaki .................... 437/101 |
| 5,858,473 A | 1/1999 | Yamazaki et al. .......... 427/554 |
| 5,859,445 A | 1/1999 | Yamazaki .................... 257/66 |
| 5,891,766 A * | 4/1999 | Yamazaki et al. .......... 438/163 |
| 5,893,730 A * | 4/1999 | Yamazaki et al. .......... 438/166 |
| 5,897,799 A | 4/1999 | Yamazaki et al. ..... 219/121.75 |
| 5,904,770 A | 5/1999 | Ohtani et al. |
| 5,923,962 A | 7/1999 | Ohtani et al. ............... 438/150 |
| 5,930,608 A | 7/1999 | Yamazaki et al. |
| 5,939,731 A | 8/1999 | Yamazaki et al. ............ 257/59 |
| 5,943,593 A | 8/1999 | Noguchi et al. ............. 438/487 |
| 5,968,383 A | 10/1999 | Yamazaki et al. ..... 219/121.75 |
| 6,002,101 A | 12/1999 | Yamazaki et al. ..... 219/121.75 |
| 6,011,277 A | 1/2000 | Yamazaki .................... 257/66 |
| 6,023,075 A | 2/2000 | Yamazaki .................... 257/72 |
| 6,066,516 A | 5/2000 | Miyasaka ................... 438/149 |
| 6,096,581 A | 8/2000 | Zhang et al. ............... 438/149 |
| 6,133,583 A | 10/2000 | Ohtani et al. |
| 6,143,661 A | 11/2000 | Kousai et al. |
| 6,159,777 A | 12/2000 | Takenouchi et al. ........ 438/149 |
| 6,204,099 B1 | 3/2001 | Kusumoto et al. |
| 6,242,292 B1 | 6/2001 | Yamazaki et al. |
| 6,261,856 B1 | 7/2001 | Shinohara et al. ............ 438/30 |
| 6,300,176 B1 | 10/2001 | Zhang et al. |
| 6,352,883 B1 | 3/2002 | Yamazaki et al. |
| 6,410,374 B1 | 6/2002 | Yamazaki |
| 6,458,200 B1 | 10/2002 | Zhang |
| 6,509,212 B1 | 1/2003 | Zhang et al. ............... 438/149 |
| 6,528,397 B1 | 3/2003 | Taketomi et al. ........... 438/487 |
| 6,723,590 B1 | 4/2004 | Zhang et al. ............... 438/166 |
| 2002/0048864 A1 | 4/2002 | Yamazaki et al. |

OTHER PUBLICATIONS

English abstract re Japanese Patent Application No. JP 10–092576, published Apr. 10, 1998.

U.S. Appl. No. 09/615,842 to Zhang et al., including copies of specification, claims, abstract, drawings and PTO filing receipt.

Fujieda, I. et al, "Self–Referenced Poly–Si TFT Amplifier Readout for a Linear Image Sensor," IDEM 93, pp. 587–590, (1993).

Bonnel, M. et al, "Polycrystalline Silicon Thin–Film Transistors with Two–Step Annealing Process," IEEE Electron Device Letters, vol. 14, No. 12, pp. 551–553, Dec., (1993).

Fuse, M. et al, "Performance of Poly–Si Thin Film Transistors Fabricated by Excimer–Laser Annealing of $SiH_4^-$ and $Si_2H_6^-$ Source Low Pressure Vapor Deposited a–Si Films With or Without Sold–Phase Crystallization," Solid State Phenomena, vols. 37–38, pp. 565–570 (1994).

Webster's II New Riverside University Dictionary, (1994).

* cited by examiner

SIDE VIEW

PLAN VIEW

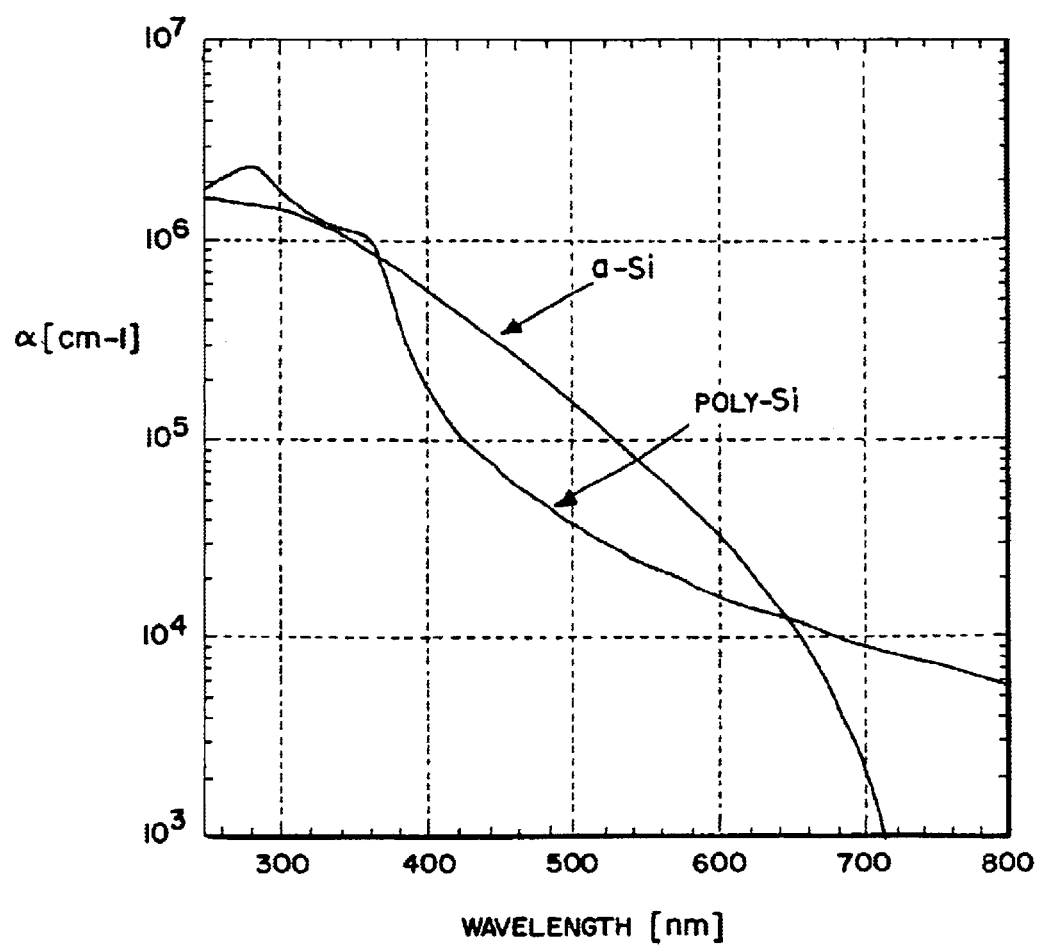

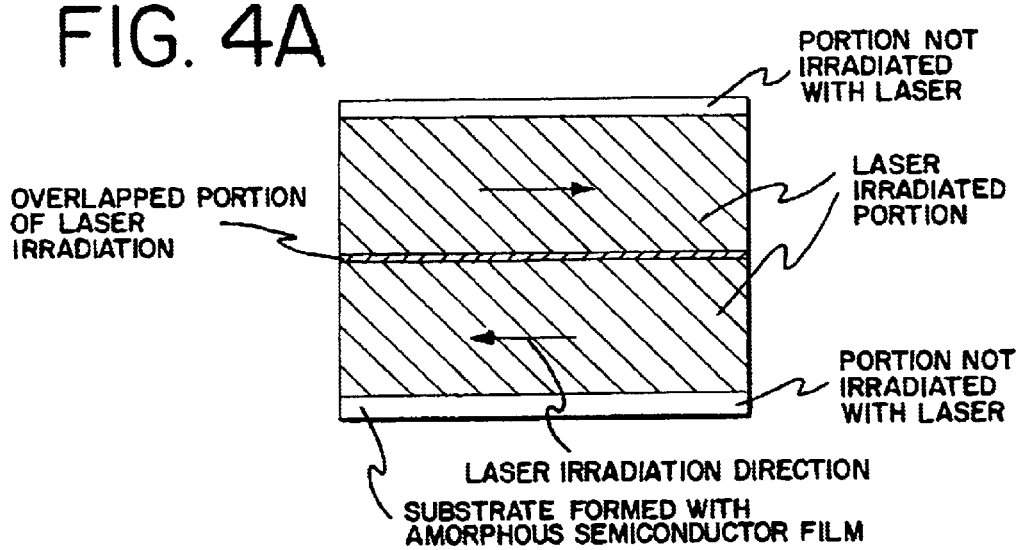
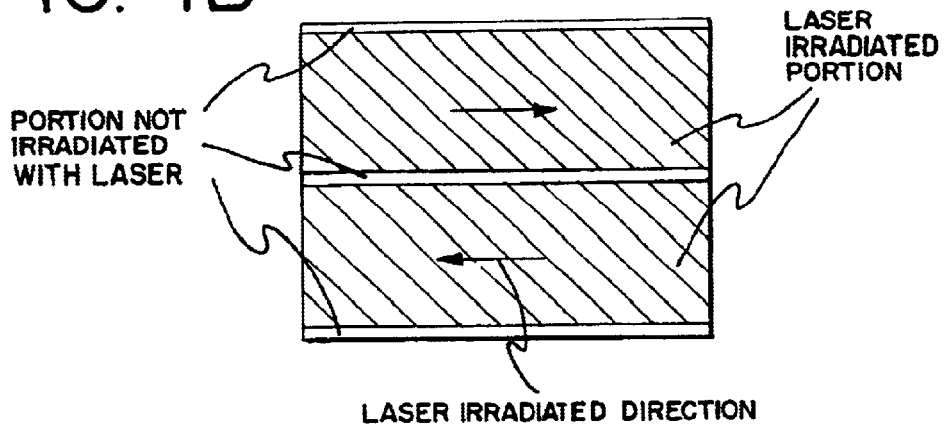
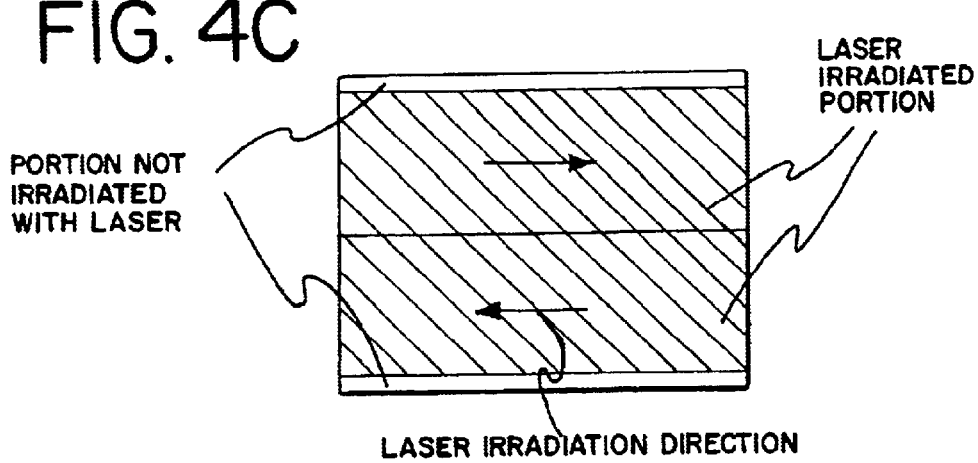

SIDE VIEW

PLAN VIEW

FIG. 6A FORMATION OF UNDERLYING FILM AND AMORPHOUS SEMICONDUCTOR FILM
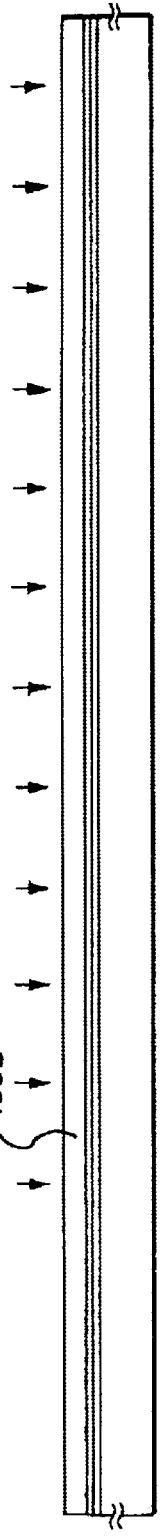
FIG. 6B CRYSTALLIZATION PROCESS
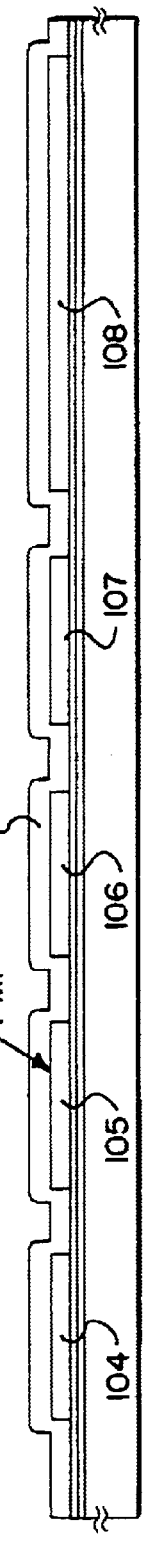
FIG. 6C FORMATION OF ISLAND-SHAPED SEMICONDUCTOR LAYER AND GATE INSULATING FILM
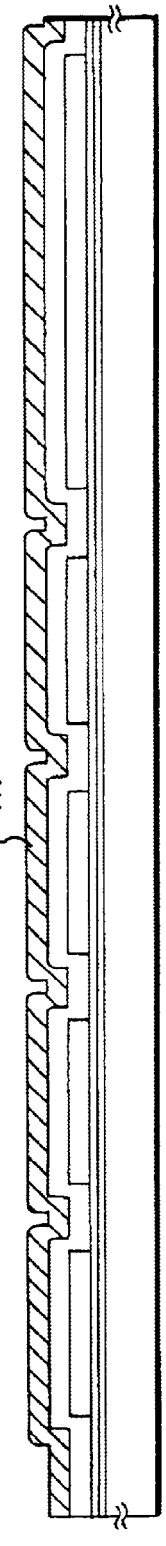
FIG. 6D FORMATION OF HEAT-RESISTANT CONDUCTIVE LAYER

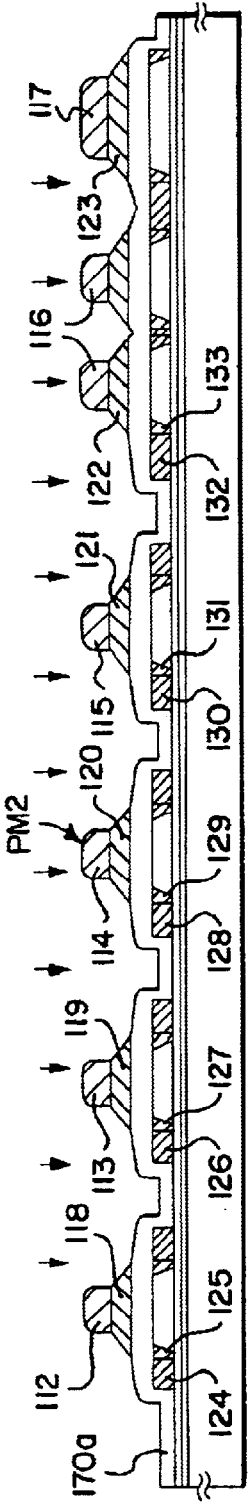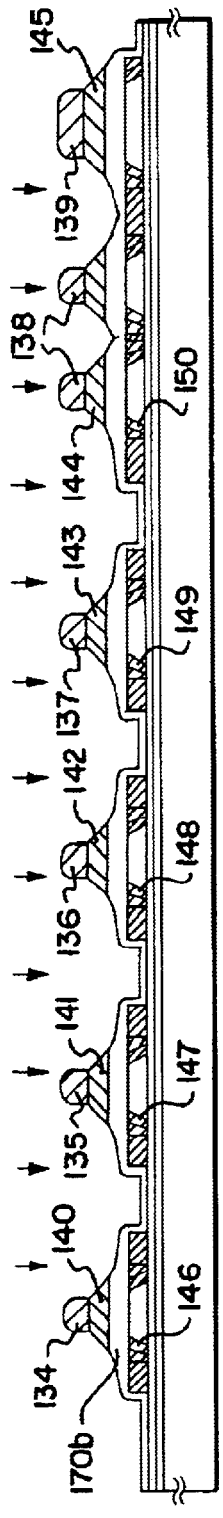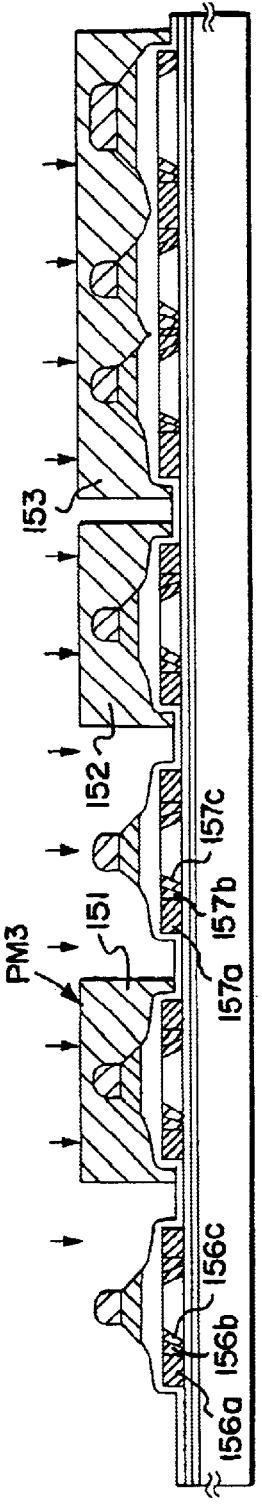

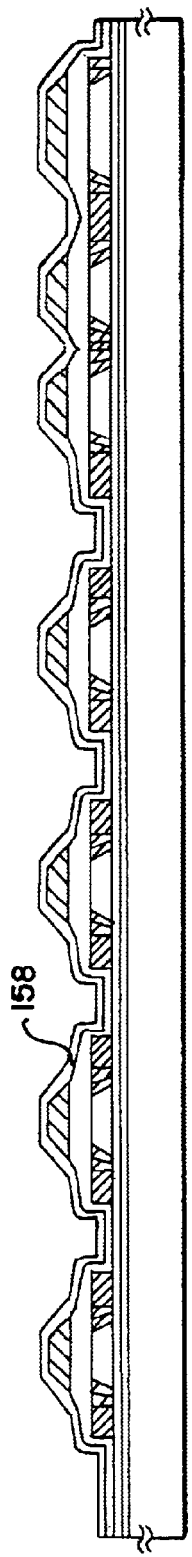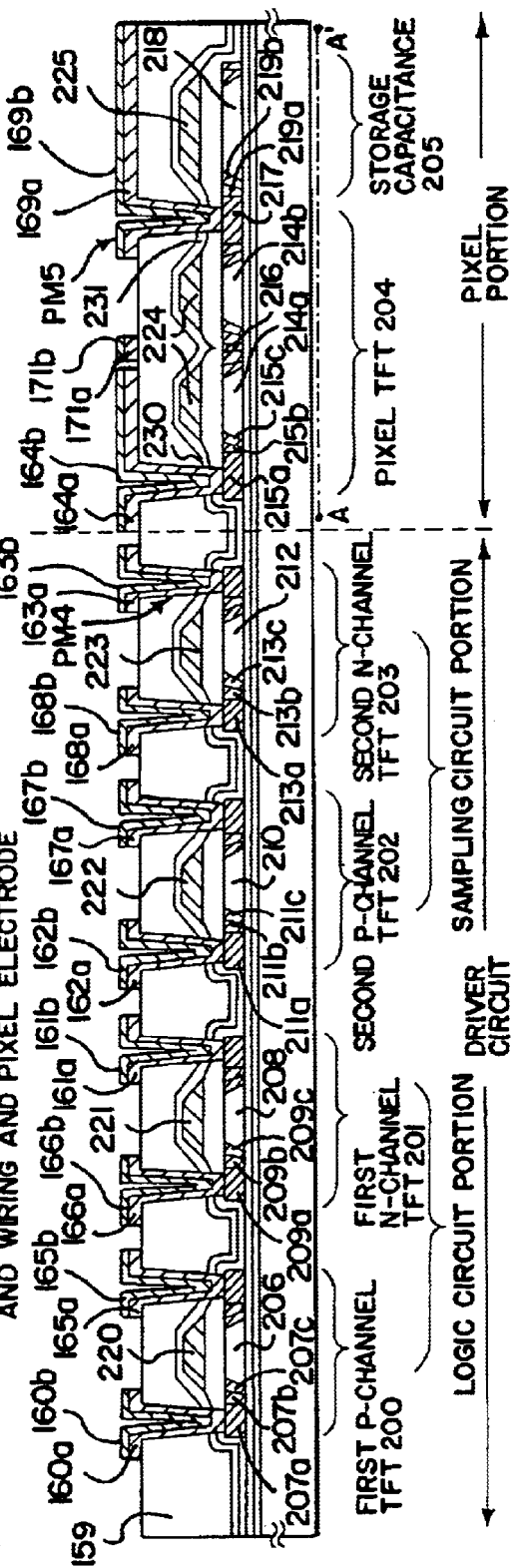
FIG. 8A FORMATION OF FIRST INTERLAYER INSULATING FILM
FIG. 8B FORMATION OF SECOND INTERLAYER INSULATING FILM AND CONTACT HOLE AND WIRING AND PIXEL ELECTRODE

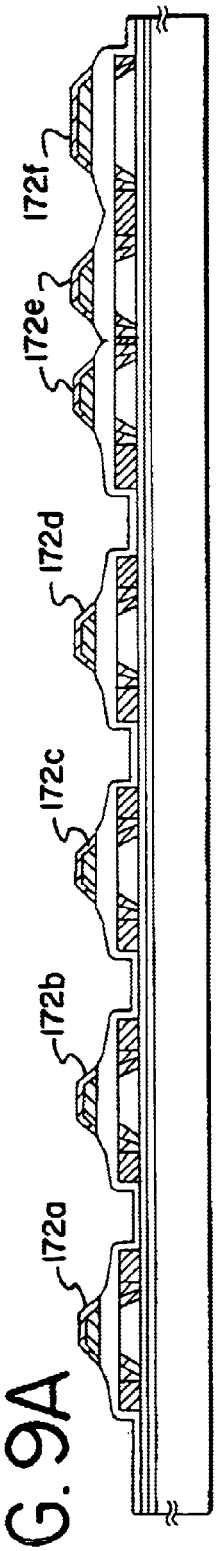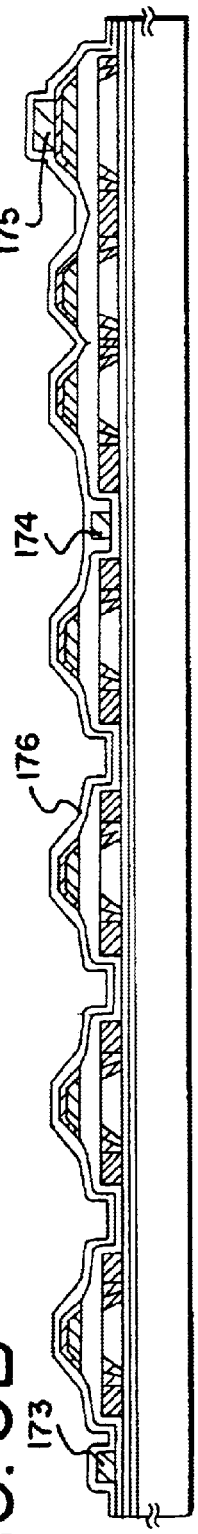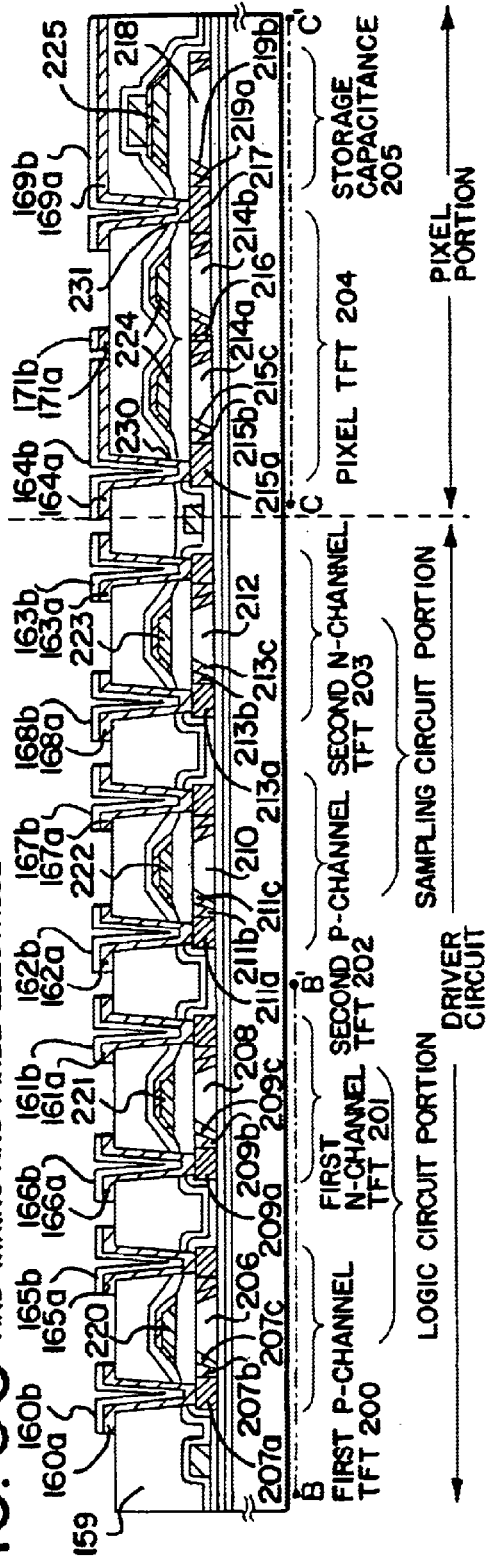

FIRST P-CHANNEL TFT 280    FIRST N-CHANNEL TFT 281

LOGIC CIRCUIT PORTION

SECOND P-CHANNEL TFT 202    SECOND N-CHANNEL TFT 203

SAMPLING CIRCUIT PORTION

PIXEL TFT 204 — RETAINING CAPACITANCE 205

PIXEL PORTION

PIXEL TFT 204 — RETAINING CAPACITANCE 205

PIXEL PORTION

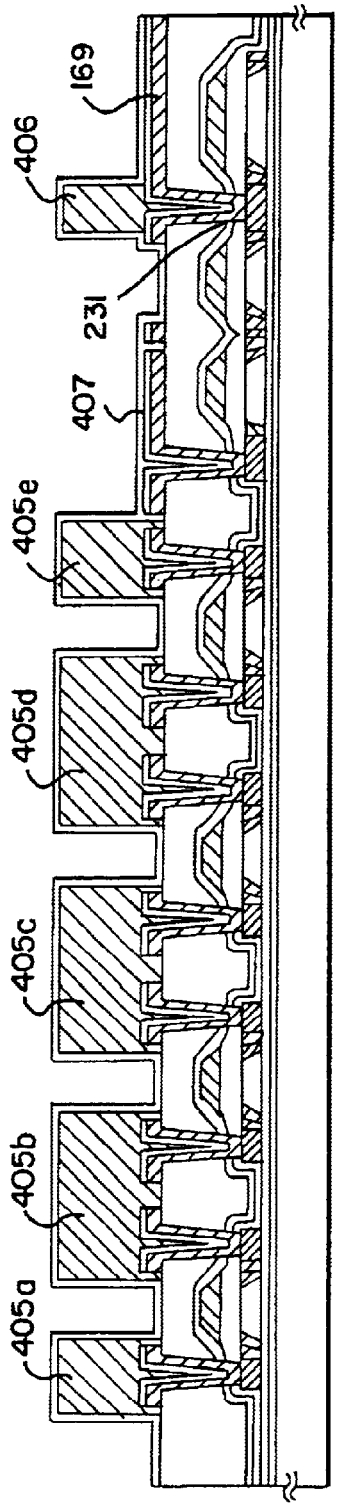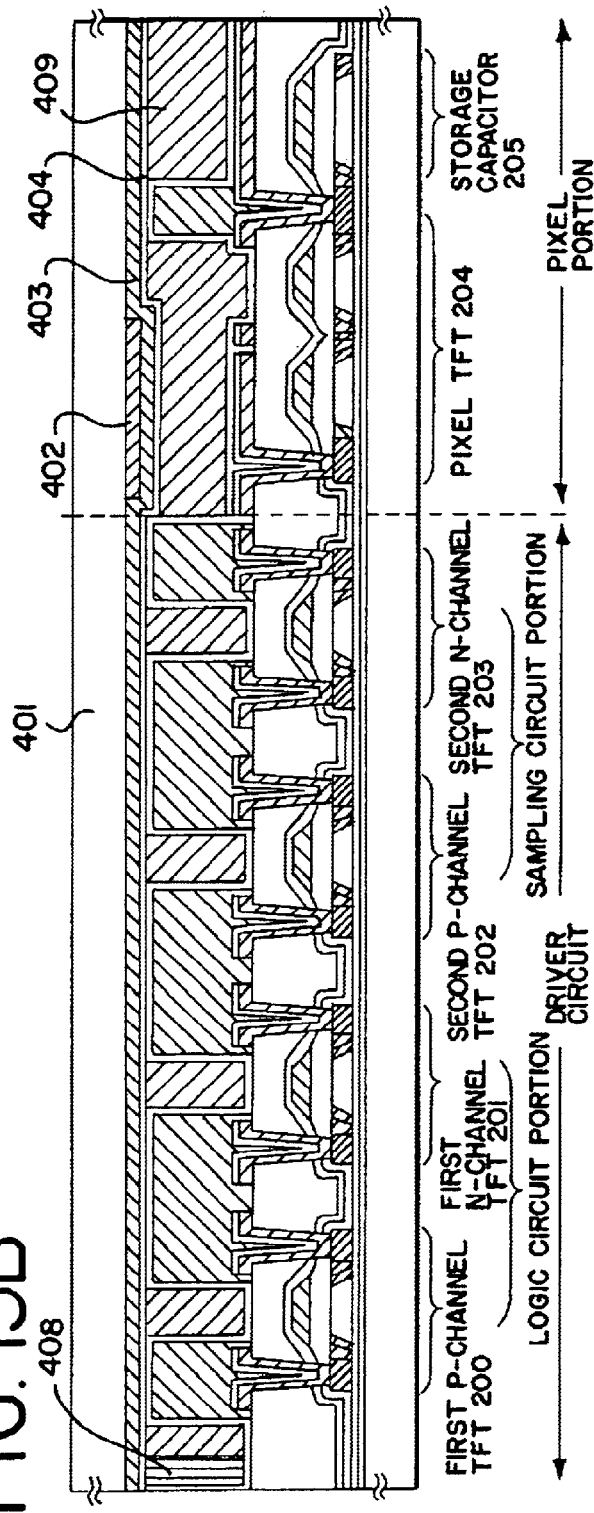

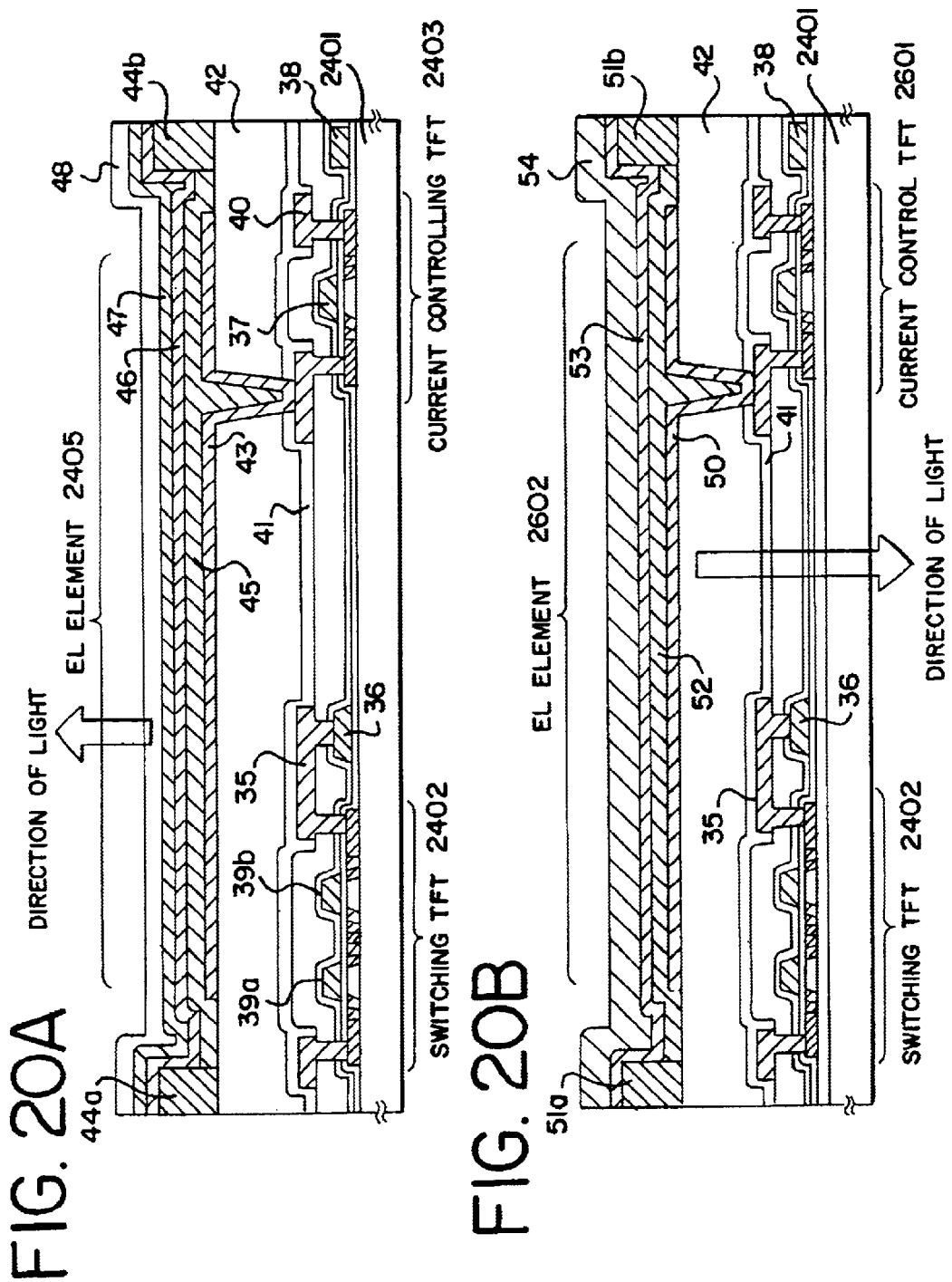

PROJECTION DEVICE (THREE PLATE TYPE)

LIGHT SOURCE OPTICAL SYSTEM

METHOD OF MANUFACTURING A SEMICONDUCTOR DEVICE

BACKGROUND OF THE INVENTION

1. Field of the Invention

The present invention relates to a method of manufacturing a semiconductor device having a circuit that is composed of a thin film transistor (hereinafter referred to as TFT). For instance, the invention relates to an electro-optical device represented by a liquid crystal display device and to electric equipment having an electro-optical device as its component. Note that the term semiconductor device herein refers to a device in general which functions through utilization of semiconductor characteristics, and that the above electro-optical device and electric equipment fall into this category.

2. Description of the Related Art

In recent years, voluminous research has been made on a laser annealing technique for crystallizing an amorphous semiconductor film formed on an insulating substrate made of glass or the like, or for improving crystallinity of a partially crystallized semiconductor film. The amorphous semiconductor film is often formed of silicon.

Glass substrates are inexpensive and more processible compared with quartz substrates widely used in the past, and they can have a large surface area without causing any difficulty. These are the reasons for the recent active research mentioned above. A laser is preferred in crystallizing a film on a glass substrate because glass substrates in general have a low melting point. In laser annealing, only the amorphous semiconductor film on the glass substrate is given high energy without increasing the temperature of the substrate much.

A crystalline semiconductor is composed of a lot of crystal grains and hence is also called a polycrystalline semiconductor. A crystalline semiconductor film formed by laser annealing has high mobility. Therefore, a thin film transistor (TFT) formed from this crystalline semiconductor film is frequently used in a monolithic liquid crystal electro-optical device in which pixel driving TFTs and driver circuit TFTs are formed on the same glass substrate.

In a laser annealing method that is preferred because of its being mass-producible and industrially superior, a laser beam of a high-power pulse laser such as an excimer laser is used. The laser beam is processed by an optical system so that the subject surface is irradiated with a several centimeters square spot-light like beam or with a linear beam 10 centimeters or more in length while running the laser beam over the subject surface (or moving the laser beam irradiation point relative to the subject surface).

The linear laser beam is particularly highly mass-producible because, unlike spot-light like laser beam which requires both longitudinal and lateral scanning, irradiation of the entire subject surface can be made by running the linear laser beam only in the direction perpendicular to the longitudinal direction of the linear beam. The reason for running the linear beam perpendicular to the longitudinal direction of the linear beam is that it is the most efficient scanning direction. Being thus highly mass-producible, to use the linear laser beam obtained by processing a pulse oscillation excimer laser beam through an appropriate optical system is becoming the mainstream laser annealing method.

FIGS. 1A and 1B show an example of the structure of an optical system for processing a laser beam into a linear shape on the subject surface. The structure shown here is very common to a degree that every beam processing optical system is stemmed from this structure of FIGS. 1A and 1B. According to this structure, energy of the laser beam is homogenized on the subject surface as well as the laser beam is shaped into a linear shape on the subject surface. An optical system that homogenizes the energy of a laser beam is called a beam homogenizer in general.

When an excimer laser that is an ultraviolet ray is used as a light source, it is preferable to form the entire optical system from quartz because this gives a high transmittance. An appropriate coating is one that has a transmittance of 99% or more regarding with the wavelength of an excimer laser used.

Reference is made first to a side view of FIG. 1A. A laser beam emitted from a laser emitter 101 is split in the direction perpendicular to the travel direction of the laser beam by cylindrical array lenses 102a and 102b. The perpendicular direction is herein referred to as longitudinal direction. The longitudinal direction is bent toward the direction of light reflected by a mirror provided in an intermediate point in the optical system. In the illustrated structure, a laser beam is split into four. These split laser beams are once bound together by a cylindrical array lens 104. The beams are then reflected by a mirror 107, and unified back to a single laser beam on an irradiation surface 109 by a doublet cylindrical lens 108. The doublet cylindrical lens is a lens composed of two cylindrical lenses. In this way, the energy of the linear laser beam along its shorter side is homogenized and the length of the shorter side is determined.

Turning next to a top view of FIG. 1B, a laser beam emitted from the laser emitter 101 is split in the direction perpendicular to the travel direction of the laser beam and perpendicular to the longitudinal direction by a cylindrical array lens 103. The direction is herein referred to as lateral direction. The lateral direction is bent toward the direction of light reflected at a mirror provided in an intermediate point in the optical system. According to the illustrated structure, the laser beam is split into seven. Thereafter, the split laser beams are combined into one beam on the subject surface 109 by the cylindrical array lens 104. Thus the energy of the linear beam is homogenized along its longer side and the length thereof is determined.

The lenses mentioned above are made of synthetic quartz in order to process an excimer laser. Also, the surfaces of the lenses are coated so that an excimer laser can easily be transmitted. These configurations give each lens a transmittance of 99% or more regarding with the excimer laser.

By running linear laser beams processed by a system structured as above in a manner that makes one linear beam overlap with its precedent laser beam along their shorter sides, the entire surface of the amorphous semiconductor can be irradiated and annealed with the laser to be crystallized. (And if this laser annealing is performed on a partially crystallized semiconductor, its crystallinity can be improved.)

Now, a typical manufacturing method of a semiconductor film to be an irradiation subject is described. First, a 5 inch square Corning 1737 substrate 0.7 mm in thickness is prepared. Using a plasma CVD device, an $SiO_2$ film (silicon oxide film) with a thickness of 200 nm is formed on the substrate and an amorphous silicon film (hereinafter referred to as a-Si film) with a thickness of 50 nm is formed on the surface of the $SiO_2$ film. Then the substrate is exposed to nitrogen gas at a temperature of 500° C. for an hour to reduce the hydrogen concentration of the film. The film is thus remarkably improved in laser resistivity.

A laser apparatus used here is the XeCl excimer laser L 3308 (wavelength: 308 nm, pulse width: 30 ns) manufactured by Lambda Physik, Inc. This laser apparatus emits a pulse oscillation laser and is capable of outputting an energy of 500 mJ/pulse. The size of the laser beam is 10×30 mm (both are half-width in the beam profile) at its exit. The term laser beam exit is defined herein as a plane perpendicular to the travel direction of a laser beam immediately after the laser beam is emitted from the laser irradiation apparatus.

A laser beam emitted from an excimer laser is generally shaped into a rectangular shape and is within 3 to 5 aspect ratio. As to the intensity of the laser beam, it has a Gaussian distribution with the center of the laser beam being the strongest. The laser beam is changed by the optical system structured as shown in FIGS. 1A and 1B into a 125 mm×0.4 mm linear beam having a uniform energy distribution.

FIGS. 2A to 2D are top views of the substrate while being irradiated with two pulses of the linear beam. The overlap pitch of the linear beam is different among FIGS. 2A to 2D. When the above semiconductor film is irradiated with the laser, the optimal overlap pitch is about 1/10 of the beam width (half-width in the beam profile) of the linear beam as shown in FIG. 2A. This improves uniformity in crystallinity of the film. The half-width in the above example is 0.4 mm, and hence the laser beam irradiation is made by setting the pulse frequency of the excimer laser to 30 Hz and the scanning rate thereof to 1.0 mm/s. The energy density on the surface irradiated with the laser beam is 420 mJ/cm² at this point. This method described here is a very common one used in crystallizing a semiconductor film with a linear laser beam.

When laser annealing is conducted using an optical system as the one shown in FIGS. 1A and 1B, a laser beam is processed to have a linear shape so that the subject surface is irradiated with a linear beam. As shown in FIG. 2A, the overlap pitch of the linear beam is in the order of 1/10 of the beam width (half-width in the beam profile).

The wavelength of an excimer laser is 308 nm as shown in FIG. 3. Therefore the absorption coefficient at this wavelength is $1.38 \times 10^6$ cm$^{-1}$ in an amorphous silicon film and $1.56 \times 10^6$ cm$^{-1}$ in a polycrystalline silicon film. Thus the absorption coefficient of the excimer laser is the same for an amorphous silicon film and a polycrystalline silicon film.

These facts result in that recrystallization of already crystallized portion repeatedly occur in laser annealing with an excimer laser. This is the cause of fluctuation in grain size.

The longer side of the linear beam is about 100 mm in length under the present circumstances. Even when a beam expander is used, the longer side of the linear beam can only be extended to have a length of 150 mm at most without sacrificing the uniformity of the linear beam.

On the other hand, there is the trend toward larger-area substrates and it is not uncommon to use, for example, a 320 mm×400 mm substrate and an 8 inch circular substrate (about 200 mm in diameter). Shown in FIGS. 4A to 4C and in FIGS. 26A to 26C are examples of irradiating such a large-area substrate with the linear laser beam. FIGS. 4A to 4C and FIGS. 26A to 26C each show an example in which a 320 mm×400 mm substrate is irradiated with a linear laser beam whose longer side is 15 cm in length. In the various irradiation methods illustrated in FIGS. 4A to 4C and FIGS. 26A to 26C, the linear beam overlaps with another linear beam at the center of the substrate (FIG. 4A and FIG. 26A), or the center of the substrate is not irradiated with laser (FIG. 4B and FIG. 26B). Both ends along the longer side of the linear beam are significantly lower in terms of energy density than around the center of the linear beam. Therefore the crystallinity at the center of the substrate is not well also in the case of employing the irradiation methods shown in FIGS. 4C and 26C. It is thus impossible to obtain a desirable electric characteristic in measuring the electric characteristic of a TFT formed from the central portion of the substrate.

SUMMARY OF THE INVENTION

The present invention has been made in view of the above and an object of the present invention is therefore to provide a method in which an amorphous semiconductor film is annealed with an excimer laser and then further subjected to laser annealing by a second harmonic of a YAG laser to thereby obtain highly uniform crystallinity. With this method, when a large-area substrate is annealed with a laser, the central portion of the substrate which conventionally cannot been used for forming a TFT can effectively be used.

FIG. 3 shows the relation between the absorption coefficient and the wavelength in an amorphous silicon film and a polycrystalline silicon film. As shown in FIG. 3, in the case of an excimer laser whose wavelength is 308 nm, the absorption coefficient in an amorphous silicon film is $1.38 \times 10^6$ cm$^{-1}$ whereas the absorption coefficient in a polycrystalline silicon film is $1.56 \times 10^6$ cm$^{-1}$. In the case of a second harmonic of a YAG laser whose wavelength is 532 nm on the other hand, the absorption coefficient in an amorphous silicon film is $9.31 \times 10^4$ cm$^{-1}$ whereas the absorption coefficient in a polycrystalline silicon film is $2.74 \times 10^4$ cm$^{-1}$.

From the above, it can be understood that an excimer laser is absorbed in an amorphous silicon film and a polycrystalline silicon film to the same extent whereas a second harmonic of a YAG laser is absorbed in an amorphous silicon film more than in a polycrystalline silicon film.

BRIEF DESCRIPTION OF THE DRAWINGS

In the accompanying drawings:

FIG. 3 is a graph showing the relation between the wavelength and the absorption coefficient in an amorphous silicon film and a polycrystalline silicon film;

FIGS. 4A to 4C are diagrams showing examples of a method of irradiating a large-area substrate with a linear laser beam;

FIGS. 6A to 6D are sectional views showing a process of manufacturing a pixel TFT and a driver circuit TFT;

FIGS. 7A to 7C are sectional views showing the process of manufacturing a pixel TFT and a driver circuit TFT;

FIGS. 8A and 8B are sectional views showing the process of manufacturing a pixel TFT and a driver circuit TFT;

FIGS. 9A to 9C are sectional views showing another process of manufacturing a pixel TFT and a driver circuit TFT;

FIGS. 15A and 15B are sectional views showing a process of manufacturing an active matrix liquid crystal display device;

FIGS. 20A and 20B are sectional views showing a pixel portion of the EL display device;

DETAILED DESCRIPTION OF THE PREFERRED EMBODIMENT

An excimer laser is high power and is capable of emitting a highly repetitive pulse of about 300 Hz under the present circumstances, so that it is often used in crystallizing a semiconductor film. The excimer laser is also used in a step of crystallizing a semiconductor film along the course of manufacturing a liquid crystal display from a low-temperature polysilicon TFT, which is beginning to be put on the market in earnest. The excimer laser is not the only usable laser but an Ar laser, a YAG laser, a $YVO_4$ laser, etc. can also be used. In the present invention, laser annealing is conducted using an excimer laser before a second harmonic of a YAG laser is used in another laser annealing, which is a feature of the invention.

First, a method of performing laser annealing on an amorphous silicon film using an excimer laser is described. Similar to the prior art, an excimer laser is processed by an optical system as the one shown in FIGS. 1A and 1B into a linear laser beam so that it forms a linear shape on the subject surface. The amorphous silicon film is irradiated with the linear beam while moving a stage in the direction perpendicular to the longer side of the linear beam, thereby obtaining a first crystalline silicon film.

Figure 2A:
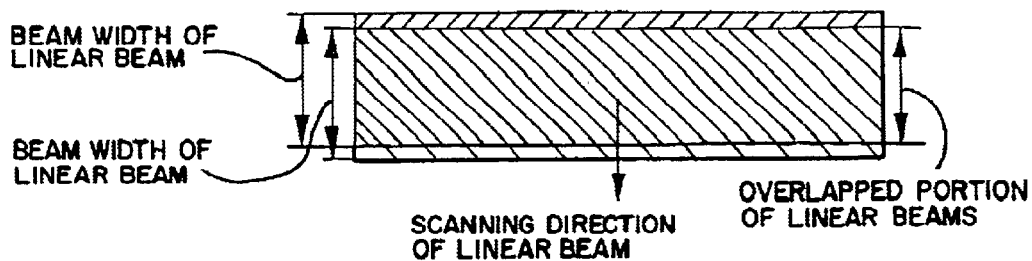
FIGS. 2A to 2D are diagrams showing examples of the overlap pitch of a linear beam in irradiation of two pulses of the linear beam.
Figure 2B:
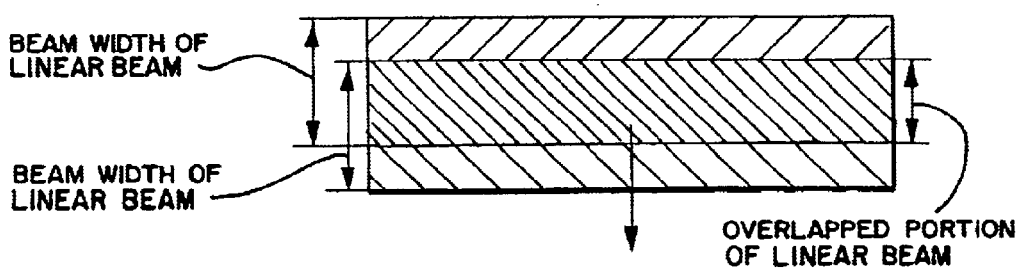
Figure 2C:
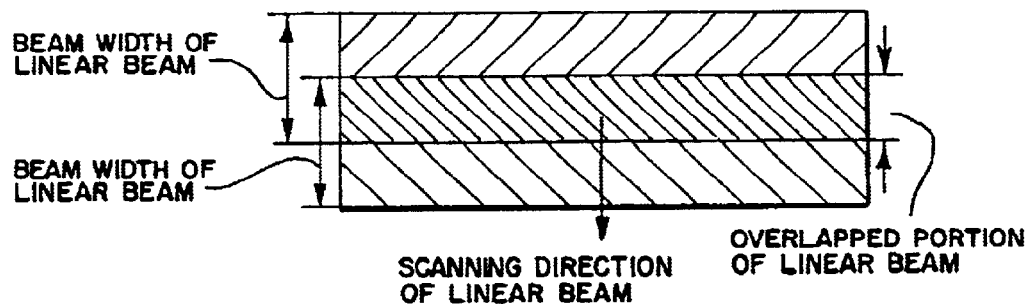
Figure 2D:
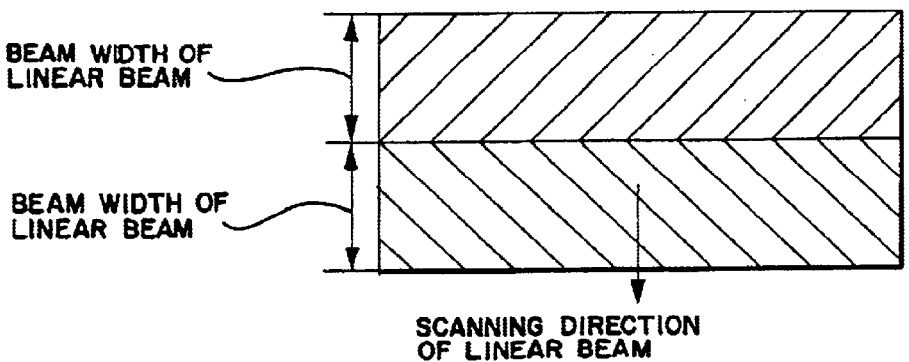

Given now is a description on the overlap pitch of the linear beam when the amorphous silicon film is irradiated with the laser. The optimal value for the overlap pitch of the linear beam varies depending on the thickness of the amorphous silicon film or other factors. Accordingly it is recommended to obtain the optimal value for each amorphous silicon film of varying thickness in advance. For instance, the overlap pitch of the linear beam may be about 1/3 of the beam width (half-width in the beam profile) of the linear beam as shown in FIG. 2B, or it may be about half the beam width of the linear beam as shown in FIG. 2C. Alternatively, the irradiation may be made while avoiding overlap between linear beams as shown in FIG. 2D. These examples are proposed because the conventional overlap pitch (meaning an overlap with the pitch about 1/10 of the beam width) fails to achieve satisfyingly uniform crystallinity. It is also because there is no need in the present invention to completely crystallize the film owing to another laser annealing by a second harmonic of a YAG laser following this first laser annealing.

Figure 1A:
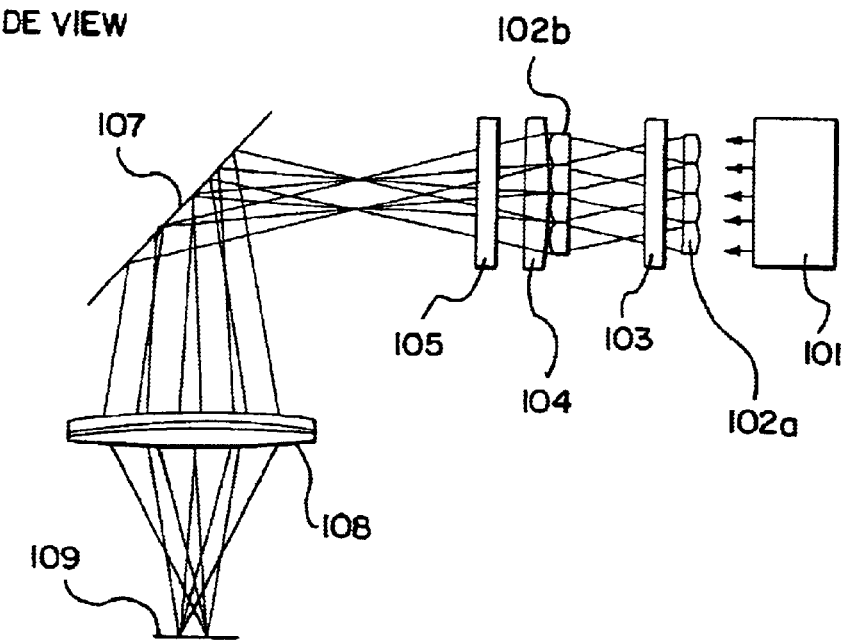
FIGS. 1A and 1B are diagrams showing a conventional optical system for forming a linear beam.
Figure 1B:
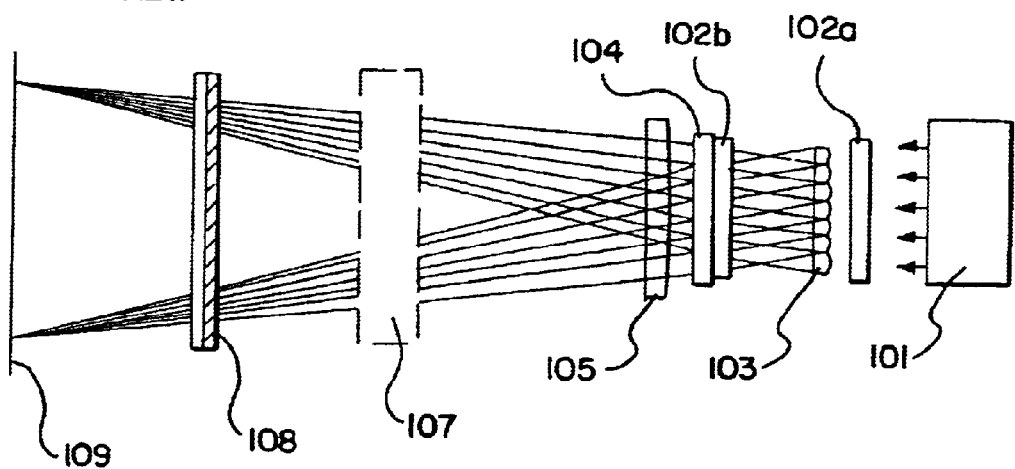

Then a second harmonic of a YAG laser is processed into a linear laser beam again using an optical system as the one shown in FIGS. 1A and 1B, so that it has a linear shape on the subject surface. The first crystalline silicon film is irradiated with the linear beam. As has been mentioned above, with a second harmonic of a YAG laser, the absorption coefficient in an amorphous silicon film is $9.31 \times 10^4$ $cm^{-1}$ whereas the absorption coefficient in a polycrystalline silicon film is $2.74 \times 10^4$ $cm^{-1}$, and the second harmonic is absorbed in an amorphous silicon film more than in a polycrystalline silicon film. Therefore the second harmonic causes laser annealing to exert greater influence on an amorphous silicon film than on a polycrystalline silicon film and crystallizes the amorphous silicon film. In other words, the second harmonic crystallizes only amorphous regions without disturbing already crystallized regions. Thus obtained is a second crystalline semiconductor film having high uniformity.

The following is the reason why excimer laser annealing is conducted before the laser annealing by a second harmonic of a YAG laser instead of simply annealing with a second harmonic of a YAG laser. A YAG laser has a strong coherence, which makes it difficult to form the laser beam into a desired shape. Therefore uniform crystallization of an amorphous semiconductor film is hardly attained by YAG laser irradiation only. For that reason, laser annealing using an excimer laser is conducted first to obtain a first crystalline semiconductor film that includes both amorphous regions and crystallized regions. The first crystalline semiconductor film is then subjected to laser annealing using a second harmonic of a YAG laser to obtain a second crystalline semiconductor film that has high uniformity. Thus the laser annealing by an excimer laser has to be made before the laser annealing by a second harmonic wave of a YAG laser; namely, laser annealing process requires two steps.

The present invention is also applicable to anneal a large-area substrate with a laser. In laser annealing using an excimer laser, the laser beam is processed by an optical system as the one shown in FIGS. 1A and 1B into a linear laser beam so that it forms a linear shape on the subject surface. An amorphous silicon film is irradiated with the linear beam while moving a stage in the direction perpendicular to the longer side of the linear beam, thereby obtaining a first crystalline silicon film.

When the amorphous silicon film is irradiated with the laser, the optimal value for the overlap pitch of the linear beam varies depending on the thickness of the amorphous silicon film or other factors. For instance, the overlap pitch of the linear beam may be about 1/3 of the beam width (half-width in the beam profile) of the linear beam as shown in FIG. 2B, or it may be about half the beam width of the linear beam as shown in FIG. 2C. Alternatively, the irradiation may be made while avoiding overlap between linear beams as shown in FIG. 2D.

Next, another laser annealing is conducted using a second harmonic of a YAG laser. As has been described, the absorption coefficient of a second harmonic of a YAG laser is different between an amorphous silicon film and a polycrystalline silicon film, and the second harmonic is absorbed more in an amorphous silicon film than in polycrystalline silicon film. A portion of the amorphous silicon film which already has been crystallized is hardly affected by another laser annealing using a second harmonic of a YAG laser. Therefore, if the entire surface of a large-area substrate is annealed at once irrespective of the film mixedly including amorphous regions and crystallized regions by a second harmonic of a YAG laser, a second crystalline silicon film having high uniformity can be obtained.

Needless to say, a laser usable in the present invention is not limited to an excimer laser and a second harmonic of a YAG laser. Other preferable lasers only have to meet the following conditions from FIG. 3. The wavelength of a laser beam to be used to irradiate the amorphous semiconductor film first should be 126 to 370 nm, which makes the laser beam absorbed in an amorphous silicon film and in a polycrystalline silicon film to the same extent. The wavelength of a laser beam to be used for the subsequent irradiation should be 370 to 650 nm, which makes the laser beam absorbed more in an amorphous silicon film than in a polycrystalline silicon film.

An amorphous semiconductor film includes an amorphous silicon film, a microcrystalline semiconductor film, and the like. Other than the amorphous silicon film, the amorphous semiconductor film may be a compound semiconductor film having an amorphous structure, such as an amorphous silicon germanium film.

Embodiment 1

Embodiment 1 will describe a case in which an amorphous silicon film is formed by a sputtering apparatus and the film is subjected to laser annealing using an XeCl excimer laser and a YAG laser.

A 5 inch square Corning 1737 substrate with a thickness of 0.7 mm is prepared. A silicon oxynitride film with a thickness of 200 nm is formed on the substrate by using a plasma CVD apparatus. Then a sputtering apparatus is used to form an amorphous silicon film on the surface of the silicon oxynitride film to a thickness of 50 nm.

Thereafter, the XeCl excimer laser L3308 (wavelength: 308 nm, pulse width: 30 ns) manufactured by Lamda Physik, Inc. is used for laser annealing. This laser emitter emits a pulse oscillation laser and is capable of outputting an energy of 500 mJ/pulse. The size of the laser beam is 10×30 mm (both are half-width in the beam profile) at its exit. The laser beam emitted from the XeCl excimer laser is processed by an optical system as the one shown in FIGS. 1A and 1B into a linear beam to perform laser annealing on the film. The beam width (half-width in the beam profile) of the linear beam is 0.4 mm, and hence the laser beam irradiation is made by setting the pulse frequency of the excimer laser to 30 Hz and the scanning rate thereof to 10.0 mm/s.

Then the obtained crystalline semiconductor film is annealed by using a second harmonic of a YAG laser to crystallize its still amorphous regions. When the shape of a rod of the YAG laser used here is cylindrical, the laser beam is shaped to form a circle in section. In this case, to process this laser beam into a linear beam becomes easier if the circular beam is changed into an ellipse in section in advance by providing, downstream of the laser emitter of FIGS. 1A and 1B, a beam expander consisting of two cylindrical lenses 501 and 502. When the rod of the YAG laser is shaped like a slab, the shape of the laser beam emitted is oblong and hence the optical system of FIGS. 1A and 1B can be used as it is.

The crystalline silicon film formed in this way has high crystallinity. If this crystalline silicon film is used to form an active layer of a TFT, fluctuation in electric characteristic between TFTs can be diminished.

Embodiment 2

A description given in Embodiment 2 is a case in which an amorphous silicon film is formed by a CVD apparatus and then subjected to heat treatment followed by laser annealing using an XeCl excimer laser and a second harmonic of a YAG laser.

A 5 inch square Corning 1737 substrate with a thickness of 0.7 mm is prepared. A silicon oxynitride film with a thickness of 200 nm is formed on the substrate by using a plasma CVD apparatus. Subsequently the same plasma CVD apparatus is used to form an amorphous silicon film on the surface of the silicon oxynitride film to a thickness of 50 nm. A solution containing an element that promotes crystallization is applied to the amorphous silicon film. When a nickel acetate solution, for instance, is used as the applied solution, the entire surface of the film is coated with the nickel acetate solution (with a weight percent of 10 ppm) by spin coating.

Next, the substrate is heated in nitrogen atmosphere at a temperature of 500° C. for an hour and further heated in nitrogen atmosphere at 550° C. for four hours. Thereafter, as in Embodiment 1, the substrate is annealed with the XeCl excimer laser using an optical system as the one shown in FIGS. 1A and 1B and laser annealing by the second harmonic of the YAG laser is then conducted.

The crystalline silicon film formed in this way has high crystallinity. If this crystalline silicon film is used to form an active layer of a TFT, fluctuation in electric characteristic between TFTs can be diminished.

Embodiment 3

Embodiment 3 gives a description of a case where heat treatment is conducted before laser annealing using a KrF excimer laser and a second harmonic of a YAG laser.

Through the same method as Embodiment 2, a silicon oxynitride film and an amorphous silicon film are formed and the amorphous silicon film is coated with a solution containing an element that promotes crystallization. Then the substrate is heated in nitrogen atmosphere at a temperature of 500° C. for an hour and further heated in nitrogen atmosphere at 550° C. for four hours.

Thereafter, the substrate is annealed with a KrF excimer laser having a wavelength of 248 nm by using an optical system as the one shown in FIGS. 1A and 1B. From FIG. 3, it is found that the absorption coefficient of a KrF excimer laser whose wavelength is 248 nm is $1.64 \times 10^6$ cm$^{-1}$ and $1.86 \times 10^6$ cm$^{-1}$ for an amorphous silicon film and for a polycrystalline silicon film, respectively. Therefore a KrF excimer laser is absorbed in an amorphous silicon film and in a polycrystalline silicon film to the same extent. After the laser annealing using the KrF excimer laser, laser annealing by the second harmonic of the YAG laser is conducted.

The crystalline silicon film formed in this way has high crystallinity. If this crystalline silicon film is used to form an active layer of a TFT, fluctuation in electric characteristic between TFTs can be diminished.

Embodiment 4

Embodiment 4 describes a case where heat treatment is conducted before laser annealing using an ArF excimer laser and a second harmonic of a YAG laser.

Through the same method as Embodiment 2, a silicon oxynitride film and an amorphous silicon film are formed and the amorphous silicon film is coated with a solution containing an element that promotes crystallization. Then the substrate is heated in nitrogen atmosphere at a temperature of 500° C. for an hour and further heated in nitrogen atmosphere at 550° C. for four hours.

Thereafter, the substrate is annealed with an ArF excimer laser having a wavelength of 193 nm by using an optical system as the one shown in FIGS. 1A and 1B. Then laser annealing by the second harmonic of the YAG laser is conducted.

The crystalline silicon film formed in this way has high crystallinity. If this crystalline silicon film is used to form an active layer of a TFT, fluctuation in electric characteristic between TFTs can be diminished.

Embodiment 5

A description given in Embodiment 5 is about a case where heat treatment is conducted to perform laser annealing using a third harmonic of a YAG laser, followed by another laser annealing by a second harmonic of a YAG laser.

Through the same method as Embodiment 2, a silicon oxynitride film and an amorphous silicon film are formed and the amorphous silicon film is coated with a solution containing an element that promotes crystallization. Then the substrate is heated in nitrogen atmosphere at a temperature of 500° C. for an hour and further heated in nitrogen atmosphere at 550° C. for four hours.

Figure 5A:
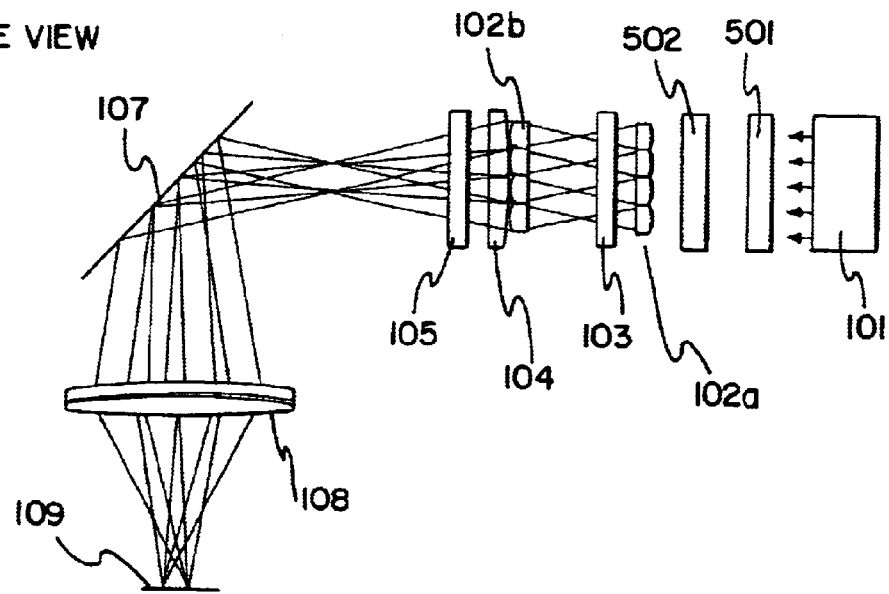
FIGS. 5A and 5B are diagrams showing an example of introducing a beam expander to the structure of FIGS. 1A and 1B.
Figure 5B:
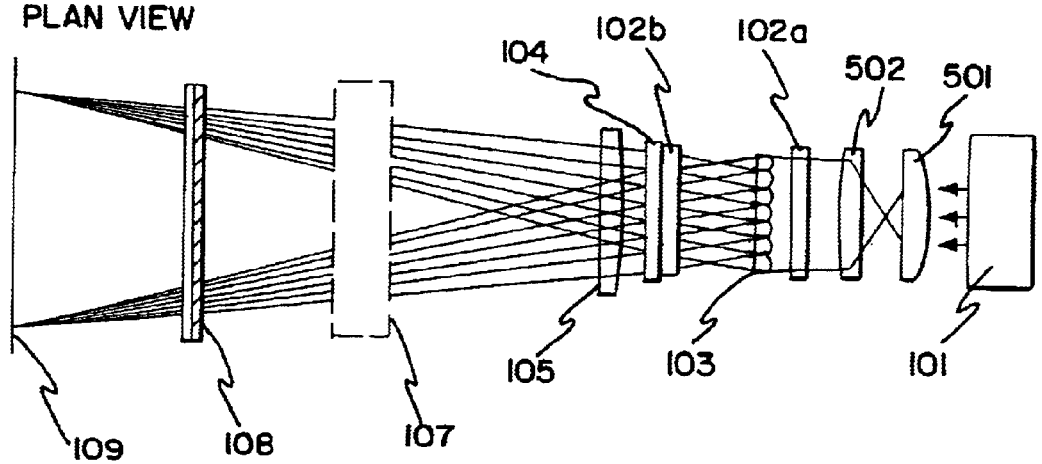

Thereafter the substrate is annealed with a third harmonic of a YAG laser. As has been described, the shape of a beam obtained from a YAG laser varies depending on the shape of its rod. A cylindrical rod produces a circular beam in section and hence the optical system shown in FIGS. 5A and 5B is used to shape the laser beam. On the other hand, the optical system shown in FIGS. 1A and 1B is used to process a rectangular beam produced from a slab-shaped rod. The amorphous semiconductor film is irradiated with the thus processed laser beam. Then laser annealing by a second harmonic of a YAG laser is conducted.

The crystalline silicon film formed in this way has high crystallinity. If this crystalline silicon film is used to form an active layer of a TFT, fluctuation in electric characteristic between TFTs can be diminished.

Embodiment 6

One of embodiments of the present invention will be described with reference to FIGS. 6A, and 8C. In particular, a method for simultaneously forming a pixel TFT and a retaining capacitance in a pixel portion as well as a TFT in a driver circuit to be disposed in the peripheral portion of the pixel portion will be described in detail.

In FIG. 6A, as a substrate 101, a glass substrate made of, e.g., barium borosilicate glass, aluminum borosilicate glass, such as a #7059 glass or a #1737 glass available from Corning, may be used. Alternatively, a quartz substrate may be used as the substrate 101. In the case where the glass substrate is employed, the substrate 101 may be heat treated in advance at a temperature lower than the glass deformation temperature by about 10 to 20° C. Then, an underlying film 102 made of an insulating film such as a silicon oxide film, a silicon nitride film, or a silicon oxynitride film is formed on a surface of the substrate 101 in which a TFT is to be formed, in order to prevent impurities from being diffused from the substrate 101. For example, a silicon oxynitride film 102a is formed from $SiH_4$, $NH_3$, and $N_2O$ with a plasma CVD method to have a thickness of 10 to 200 nm (preferably 50 to 100 nm), and then a hydrogenated silicon oxynitride film 102b is formed similarly from $SiH_4$ and $N_2O$ to have a thickness of 50 to 200 nm (preferably 100 to 150 nm). Although the underlying film 102 is described to have a two-layer structure, a single layer of an insulating film may be deposited. Alternatively, two or more layers of insulating films may be deposited as the underlying film 102.

A silicon oxynitride film is formed with a parallel-plate type plasma CVD method. For forming the silicon oxynitride film 102a, $SiH_4$ of 10 sccm, $NH_3$ of 100 sccm, and $N_2O$ of 20 sccm are introduced into the reaction chamber. Other parameters are set as follows: a substrate temperature of 325° C., a reaction pressure of 40 Pa, a discharge power density of 0.41 W/cm², and a discharge frequency of 60 MHz. On the other hand, for forming the hydrogenated oxynitride silicon film 102b, $SiH_4$ of 5 sccm, $N_2O$ of 120 sccm, and $H_2$ of 125 sccm are introduced into the reaction chamber. Other parameters are set as follows: a substrate temperature of 400° C., a reaction pressure of 20 Pa, a discharge power density of 0.41 W/cm², and a discharge frequency of 60 MHz. These two films can be continuously formed only by changing the substrate temperature and switching the reaction gases to be used.

The thus formed oxynitride silicon film 102a has a density of $9.28 \times 10^{22}$/cm³. This is a fine and hard film that exhibits a slow etching rate of about 63 nm/min at 20° C. against a mixture solution (available from Stella Chemifa under commercial designation of LAL500) which contains hydrogen fluoride ammonium ($NH_4HF_2$) of 7.13% and ammonium fluoride ($NH_4F$) of 15.4%. Such a film used as the underlying film is effective for preventing alkaline metal elements from being diffused from the glass substrate into the semiconductor layer formed on the underlying film.

Then, a semiconductor layer 103a with a thickness of 25 to 100 nm (preferably 30 to 70 nm) and having an amorphous structure is formed with a plasma CVD method, a sputtering method, or the like. A semiconductor film having an amorphous structure includes an amorphous semiconductor film and a microcrystalline semiconductor film. Alternatively, a compound semiconductor film having an amorphous structure such as an amorphous silicon germanium film may be employed. In the case where the amorphous silicon film is formed with a plasma CVD method, it is possible to continuously form both of the underlying film 102 and the amorphous semiconductor layer 103a. For example, after depositing the silicon oxynitride film 102a and the hydrogenated silicon oxynitride film 102b with a plasma CVD method as set forth above, the reaction gases are switched from the combination of $SiH_4$, $N_2O$ and $H_2$ to the combination of $SiH_4$ and $H_2$, or only $SiH_4$. Then, these films can be continuously deposited without being exposed to the ambient atmosphere. As a result, surface contamination of the hydrogenated silicon oxynitride film 102b can be prevented, and variations in the characteristics and/or a threshold voltage of the resultant TFTs can be reduced.

Thereafter, a crystallization process is performed to form a crystalline semiconductor layer 103b from the amorphous semiconductor layer 103a. For that purpose, various methods such as a laser annealing method, a thermal annealing method (a solid phase growth method), or a rapid thermal annealing method (RTA method) can be employed. In the case where the glass substrate or a plastic substrate that has poor heat-resistivity is to be employed, a laser annealing method is especially preferable to be performed. In the RTA method, an infrared lamp, a halogen lamp, a metal halide lamp, a Xenon lamp or the like is used as a light source. Alternatively, in accordance with the technique disclosed in Japanese Patent Application Laid-Open No. Hei 7-130652, the crystalline semiconductor layer 103b may be formed through a crystallization process employing metal elements. Further, the crystalline semiconductor layer 103b may also be formed through a crystallization process employing a laser annealing method and metal elements. In the crystallization process, it is preferable to allow the hydrogens contained in the amorphous semiconductor layer to be first purged. For that purpose, a heat process is performed at 400 to 500° C. for about one hour, so that the amount of hydrogens contained in the amorphous semiconductor layer is reduced to 5 atom % or lower. By performing the crystallization process thereafter, the surface of the resultant crystallized film can be prevented from being roughened.

Alternatively, when an $SiH_4$ gas and an Ar gas are used as the reaction gases and the substrate temperature is set at 400 to 450° C. during the formation process of the amorphous silicon film with the plasma CVD method, the amount of hydrogens contained in the amorphous silicon film can be reduced to 5 atom % or lower. In such a case, no heat treatment is required to be performed for purging the contained hydrogens.

For crystallization, whichever method shown Embodiments 1 to 5 can be used. Thus the crystalline semiconductor layer 103b shown in FIG. 6B can be formed.

Then, a resist pattern is formed on the crystalline semiconductor layer 103b with a photolithography technique by employing a first photomask (PM1). The crystalline semiconductor layer is divided into island-patterns by dry-etching to form island-shaped semiconductor layers 104 to 108, as shown in FIG. 6C. For the dry etching process of the crystalline silicon film, a mixture gas of $CF_4$ and $O_2$ is used.

Thereafter, impurity elements providing the p-type conductivity are added to the entire surfaces of the island-shaped semiconductor layers at the concentration of about $1 \times 10^{16}$ to $5 \times 10^{17}$ atoms/$cm^3$ for the purpose of controlling a threshold voltage (Vth) of TFTs. As the impurity elements providing the semiconductor material with the p-type conductivity, elements in Group 13 in the periodic table, such as boron (B), aluminum (Al), and gallium (Ga) are known. As the method for adding the impurity elements, the ion injecting method and the ion doping method (or the ion shower doping method) as mentioned above is suitable. For the large sized substrate, the ion doping method is suitable. With the ion doping method, boron (B) is added by employing using diborane ($B_2H_6$) as a source material gas. These doping impurity elements can be though omitted, because it is not always necessary, the process preferably employed for setting a threshold voltage of, especially an n-channel TFT, within a predetermined range.

The gate insulating film 109a is formed by depositing an insulating film containing silicon to have a film thickness of 40 to 150 nm with a plasma CVD method or a sputtering method. In this embodiment, the gate insulating film 109a is formed of a silicon oxynitride film having a thickness of 120 nm. The silicon oxynitride film formed with the source material gases obtained by adding $O_2$ into $SiH_4$ and $N_2O$ is a suitable material for the purpose since the fixed charge density in the film is reduced. Furthermore, the silicon oxynitride film formed with the source material gases of $SiH_4$ and $N_2O$ as well as $H_2$ is preferable since the interface defect density at the interface with the gate insulating film can be reduced. It should be noted that the gate insulating film is not limited to such a silicon oxynitride film, but a single-layer structure or a multilayer structure of other insulating films containing silicon may be used. For example, in the case where a silicon oxide film is used, the film can be formed with a plasma CVD method in which TEOS (Tetraethyl Orthosilicate) and $O_2$ are mixed to each other, and a discharge is generated with a reaction pressure of 40 Pa, a substrate temperature of 300 to 400° C., and a high frequency (13.56 MHz) power density of 0.5 to 0.8 W/cm. The thus formed silicon oxide film can exhibit satisfactory characteristics as a gate insulating film by being subjected to a thermal annealing process at 400 to 500° C.

Thereafter, as shown in FIG. 6D, a heat-resistant conductive layer 111 for forming a gate electrode is formed on the gate insulating film 109a with a first shape so as to have a thickness of 200 to 400 nm (preferably 250 to 350 nm). The heat-resistant conductive layer may be a single layer, or alternatively, have a layered-structure including a plurality of layers such as two or three layers, if necessary. The heat-resistive conductive layer in the present specification includes a film made of elements selected from the group consisting of Ta, Ti, and W, an alloy film including the aforementioned elements as constituent components, or an alloy film in which the aforementioned elements are combined. These heat-resistive conductive layers can be formed with a sputtering method or a CVD method, and it is preferable to reduce the concentration of impurities contained therein in order to obtain a low resistance. Especially, the oxygen concentration is preferably set to be at 30 ppm or lower. In this embodiment, the W film may be formed to have a thickness of 300 nm. The W film may be formed with a sputtering method employing a W target, or with a thermal CVD method employing hexafulouride tungsten ($WF_6$). In either case, the resistance of the film is required to be lowered in order to be used as a gate electrode, so that the resistivity of the resultant W film is preferably set to be at $20\mu\Omega\cdot cm$ or lower. The W film can have a lower resistivity with a larger grain size. However, when a larger amount of impurity elements such as oxygens is contained in the W film, crystallization is adversely affected to cause high resistance. Thus, in the case where a sputtering method is employed to form a W film, a W target with the purity of 99.9999% is employed, and sufficient attention is paid so as to prevent impurities from being mixed into the W film from the ambient atmosphere during the deposition, thereby resulting in a resistivity of 9 to $20\mu\Omega\cdot cm$.

On the other hand, in the case where a Ta film is used as the heat-resistive conductive layer 111, the film can be similarly formed with a sputtering method. For the Ta film, an Ar gas is used as a sputtering gas. In addition, when an appropriate amount of Xe or Kr is added into the gas during the sputtering process, an internal stress of the resultant film can be relaxed so that the film can be prevented from being peeled off. The resistivity of the a-phase Ta film is about $20\mu\Omega\cdot cm$, and thus can be used as a gate electrode. However, the β-phase Ta film has the resistivity of about $180\mu\Omega\cdot cm$, which is not suitable for forming a gate electrode. Since the TaN film has a crystal structure close to that of the α-phase Ta film, the α-phase Ta film can be easily obtained by forming the underlying TaN film prior to the deposition of the Ta film. In addition, although not illustrated, it is effective to form a silicon film having a thickness of about 2 to 20 nm and doped with phosphorus (P) below the heat-resistive conductive layer 111. Thus, close adhesion to the overlying conductive film as well as prevention of oxidation can be realized, and furthermore, alkaline metal elements contained in the heat-resistive conductive layer 111 at a minute amount can be prevented from being diffused into the gate insulating film 109a having the first shape. In either case, it is preferable to set the resistivity of the heat-resistive conductive layer 111 in the range from 10 to $50\mu\Omega\cdot cm$.

Then, other masks 112 to 117 made of a resist are formed with a photolithography technique by employing a second photomask (PM2). A first etching process is then performed. In this embodiment, an ICP etching apparatus is employed with $Cl_2$ and $CF_4$ as etching gases, and the etching is performed by forming plasma with an applied RF (13.56 MHz) power of 3.2 mW/cm$^2$ under a pressure of 1 Pa. An RF (13.56 MHz) power of 224 mW/cm$^2$ is also applied to the substrate (to a sample stage), so that substantially a negative self-biasing voltage can be applied. An etching speed of the W film under the above conditions is about 100 nm/min. In the first etching process, a time period required for the W film to be just etched away is calculated based on the above-mentioned etching speed, and the resultant time period is increased by 20% to be set as the actual etching time period.

Conductive layers 118 to 123 having a first tapered shape are formed through the first etching process. The tapered angle of 15 to 30 degrees can be obtained. In order to perform the etching process without remaining any etching residue, overetching is performed in which an etching time is increased by 10 to 20%. A selection ratio of the silicon oxynitride film (the gate insulating film 109a having the first shape) with respect to the W film is about 2 to 4 (typically 3), and therefore, the exposed surface of the silicon oxynitride film can be etched away by about 20 to 50 nm through the overetching, so that a gate insulating film 109b can be formed to have a second shape in which tapered shapes are formed in the vicinity of end portions of the conductive layer having the first tapered shape.

Thereafter, a first doping process is performed so that impurity elements with one conductivity type are added into the island-shaped semiconductor layers. In this embodiment, the impurity elements providing the n-type conductivity are added. The masks 112 to 117 used for forming the first-shaped conductive layers are remained, and the conductive layers 118 to 123 having the first tapered shapes are used as masks so that the impurity elements for providing the n-type conductivity are added with the ion doping method in a self-aligning manner. In order that the impurity elements for providing the n-type conductivity are added so as to pass through the tapered portion and the gate insulating film at the end portion of the gate electrode and reach the underlying semiconductor layer, the dosage is set in the range from $1\times10^{13}$ to $5\times10^{14}$ atoms/cm$^2$ and the accelerating voltage is set in the range from 80 to 160 kV. As the impurity elements for providing the n-type conductivity, elements in Group 15 in the periodic table, typically phosphorus (P) or arsenic (As), can be used. In this embodiment, phosphorus (P) is used. Through the above-described ion doping method, the impurity elements for providing the n-type conductivity are added to first impurity regions 124 to 128 in the concentration range from $1\times10^{20}$ to $1\times10^{21}$ atoms/cm$^3$, while the impurity elements for providing the n-type conductivity are added to a second impurity regions (A) formed below the tapered portions in the concentration range from $1\times10^{17}$ to $1\times10^{20}$ atoms/cm$^3$, although not necessarily uniformly added in the regions.

In this process, in the second impurity regions (A) 129 to 132, the concentration profiles of the impurity elements for providing the n-type conductivity to be contained in at least portions overlapping with the first-shaped conductive layers 118 to 123 reflect changes in the film thickness of the tapered portions. More specifically, the concentration of phosphorus (P) to be added into the second impurity regions (A) 129 to 132 in the regions overlapping with the first-shaped conductive layers is gradually reduced inwardly from the end portion of the conductive layer. This is because the concentration of phosphorus (P) that can reach the semiconductor layer is changed depending on differences in the film thickness of the tapered portions.

Then, as shown in FIG. 7B, a second etching process is performed. This etching process is similarly performed with the ICP etching apparatus by employing a mixture gas of $CF_4$ and $Cl_2$ as an etching gas under the conditions of an applied RF power of 3.2 W/cm$^2$ (13.56 MHz) and a bias power of 45 mW/cm$^2$ (13.56 MHz) under a pressure of 1.0 Pa. Thus, conductive layers 140 to 145 are formed to have a second shape obtainable under these conditions. Tapered portions are formed at respective end portions thereof, in which a thickness is gradually increased inwardly from the respective end portions. As compared with the first etching process, an isotropic etching component is increased due to a reduction in the bias power to be applied to the substrate side, so that the tapered portions are formed to have an angle of 30 to 60 degrees. In addition, the surfaces of the gate insulating films 109b having the second shape are etched way by about 40 nm, and third gate insulating films 109c are newly formed.

Thereafter, the impurity elements for providing the n-type conductivity are doped with a reduced dosage at a higher accelerating voltage, as compared to the first doping process. For example, the accelerating voltage is set in the range from 70 to 120 kV and the dosage is set at $1\times10^{13}$ atoms/cm$^2$. The concentrations of the impurity elements to be included in the regions overlapping with the conductive layers 140 to 145 having the second shape are set to be in the range from $1\times10^{16}$ to $1\times10^{18}$ atoms/cm$^3$. Thus, the second impurity regions (B) 146 to 150 are formed.

Then, impurity regions 156 and 157 with the opposite conductivity are formed in the island-shaped conductive layers 104 and 106 that constitute p-channel TFTs. The impurity elements for providing the p-type conductivity are doped with the second-shaped conductive layers 140 and 142 as masks to form the impurity regions in a self-aligning manner. In this case, the island-shaped semiconductor layers 105, 107, 108 that constitute the n-channel TFTs are entirely covered with resist masks 151 to 153 formed by employing a third photomask (PM3). The impurity regions 156 and 157 in this stage are formed with the ion doping method employing diborane ($B_2H_6$). The concentrations of the impurity elements for providing the p-type conductivity in the impurity regions 156 and 157 are set in the range from $2\times10^{20}$ to $2\times10^{21}$ atoms/cm$^3$.

However, these impurity regions 156 and 157 when viewed in more detail can be divided into three regions containing the impurity elements for providing the n-type conductivity. More specifically, third impurity regions 156a and 157a contain the impurity elements for providing the n-type conductivity in the range from $1\times10^{20}$ to $1\times10^{21}$ atoms/cm$^3$, fourth impurity regions (A) 156b and 157b contain the impurity elements for providing the n-type conductivity in the range from $1\times10^{17}$ to $1\times10^{20}$ atoms/cm$^3$, and the fourth impurity regions (B) 156c and 157c contain the impurity elements for providing the n-type conductivity in the range from $1\times10^{16}$ to $5\times10^{18}$ atoms/cm$^3$. However, when the concentrations of the impurity elements for providing the p-type conductivity are set to be at $1\times10^{19}$ atoms/cm$^3$ or more in the impurity regions 156b, 156c, 157b, and 157c, and the concentrations of the impurity elements for providing the p-type conductivity are set to become 1.5 to 3 times larger in the third impurity regions 156a and 157a, no adverse problems occur for allowing the third impurity regions to function as source and drain regions of the p-channel TFTs. In addition, portions of the fourth impurity regions (B) 156c and 157c are formed to overlap with the conductive layer 140 or 142 having the second tapered shape.

Thereafter, as shown in FIG. 8A, a first interlayer insulating film 158 is formed over the gate electrodes and the gate insulating films. The first interlayer insulating film may be formed of a silicon oxide film, a silicon nitride film, a silicon oxynitride film, or a layered film in which these films are combined. In either case, the first interlayer insulating film 158 is formed of an inorganic insulating material. The film thickness of the first interlayer insulating film 158 is set to be in the range from 100 to 200 nm. When a silicon oxide film is to be employed, the film is formed with the plasma CVD method in which TEOS and $O_2$ are mixed to each other, and the discharge is generated under the conditions of a reaction pressure of 40 Pa, a substrate temperature in the range of 300 to 400° C., and a high frequency (13.56 MHz) power density of 0.5 to 0.8 W/cm². When a silicon oxynitride film is to be employed, the film is formed of a silicon oxynitride film formed with the plasma CVD method from $SiH_4$, $N_2O$, and $NH_3$, or a silicon oxynitride film formed with the plasma CVD method from $SiH_4$ and $N_2O$. The film formation conditions in these cases are set as follows: a reaction pressure in the range from 20 to 200 Pa, a substrate temperature in the range of 300 to 400° C., and a high frequency (60 MHz) power density of 0.1 to 1.0 W/cm². Alternatively, a hydrogenated silicon oxynitride film formed from $SiH_4$, $N_2O$, and $H_2$ may also be used. A silicon nitride film can also be formed with a plasma CVD method from $SiH_4$ and $NH_3$.

Then, a process for activating the impurity elements providing the p-type and n-type conductivities added at the respective concentrations is performed. This process is realized as a thermal annealing method which employs a furnace anneal oven. Alternatively, a laser annealing method, or a rapid thermal annealing method (RTA method) may be applied for that purpose. The thermal annealing is performed within a nitrogen atmosphere having the oxygen concentration of 1 ppm or lower, preferably 0.1 ppm or lower, at 400 to 700° C., typically 500 to 600° C. In this embodiment, the thermal annealing is performed at 550° C. for 4 hours. In the case where a plastic substrate having a low heating endurance temperature is employed, a laser annealing method is preferably employed.

After the activation process, the surrounding atmospheric gases are switched to a hydrogen atmosphere containing hydrogens at the concentration of 3 to 100%. A heat process is performed in this atmosphere at 300 to 450° C. for 1 to 12 hours so that the island-shaped semiconductor layers are hydrogenated. In this process, dangling bonds existing in the island-shaped semiconductor layers at the concentration of $10^{16}$ to $10^{18}/cm^3$ are terminated with thermally excited hydrogens. As another means for the hydrogenation, plasma hydrogenation (in which hydrogens excited by means of plasma are employed) may be performed. In either case, the defect densities in the island-shaped semiconductor layers 104 to 108 are preferably set to be at $10^{16}/cm^3$ or lower. For that purpose, hydrogens in the island-shaped semiconductor layers are added at the concentration of about 0.01 to 0.1 atomic %.

Then, a second interlayer insulating film 159 made of an organic insulating material is formed from 1.0 to 1.5 μm. As the organic insulating material, polyimide, acryl, polyamide, polyimideamide, BCB (benzocyclobutene), or the like maybe used. Here, polyimide of the type that is thermally polymerized after being applied to the substrate is used, and the film is formed by carrying out baking at 300° C.

By thus forming the second interlayer insulating film of an organic insulating material, the surface thereof can be easily planarized. In addition, since the organic resign material has in general a low dielectric constant, a parasitic capacitance can be reduced. However, the organic insulating material tends to absorb water, and therefore, is not suitable for the use as a protective film. Accordingly, as in this embodiment, it is preferable to combine the organic insulating film with a silicon oxide film, a silicon oxynitride film or a silicon nitride film formed as the first interlayer insulating film 158.

Thereafter, a resist mask having a predetermined pattern is formed by employing a fourth photomask (PM4) to form contact holes that reach the respective impurity regions formed in the island-shaped semiconductor layers so as to function as a source or drain region. These contact holes are formed with a dry etching method. In this case, a mixture gas of $CF_4$, $O_2$, and He is used as an etching gas to first etch away the second interlayer insulating film 159 made of the organic insulating material. The first interlayer insulating film 158 is then etched away with a mixture gas of $CF_4$ and $O_2$ as an etching gas. Furthermore, the etching gas is switched to $CHF_3$ so as to enhance a selection ratio with respect to the island-shaped semiconductor layers, and the gate insulating films 109c having the third shape are etched away, thereby resulting in the contact holes being formed.

Thereafter, a conductive metal film is formed with a sputtering method or a vacuum evaporation method. A resist mask pattern is formed by employing a fifth photomask (PM5), and another etching process is performed to form source wirings 160 to 164 and drain wirings 165 to 168. A pixel electrode 169 can be formed simultaneously with the drain wirings. A pixel electrode 171 represents the one belonging to the adjacent pixel. Although not illustrated, the wirings in this embodiment are formed as follows. A Ti film having a thickness of 50 to 150 nm is formed to be in contact with the impurity regions in the island-shaped semiconductor layers functioning as the source/drain regions. Aluminum (Al) films with a thickness of 300 to 400 nm (in FIG. 8C, designated with reference numerals 160a to 169a) are overlaid on the Ti films, and further transparent conductive films with a thickness of 80 to 120 nm (in FIG. 8C, designated with reference numerals 160b to 169b) are overlaid thereon. As the transparent conductive films, an indium-oxide-zinc-oxide alloy ($In_2O_3$—ZnO) and zinc oxide (ZnO) are also suitable materials. Moreover, zinc oxide having gallium (Ga) added thereto (Zno:Ga) for improving a transmittance of visible lights or an electrical conductivity may be advantageously used.

Thus, by employing five photomasks, a substrate in which the TFT in the driver circuit and the pixel TFT in the pixel portion are formed on the identical substrate can be provided. In the driver circuit, a first p-channel TFT 200, a first n-channel TFT 201, a second p-channel TFT 202, and a second n-channel TFT 203 are formed, while a pixel TFT 204 and a storage capacitance 205 are formed in the pixel portion. In the present specification, such a substrate is referred to as an active matrix substrate for the purpose of convenience.

In the first p-channel TFT 200 in the driver circuit, the conductive layer having the second tapered shape functions as its gate electrode 220. Moreover, the TFT 200 has the structure in which there are provided within the island-shaped semiconductor layer 104, a channel forming region 206, a third impurity region 207a to function as a source or drain region, a fourth impurity region (A) 207b for forming an LDD region not overlapping with the gate electrode 220, and another fourth impurity region (B) 207c for forming an LDD region partially overlapping with the gate electrode 220.

In the first n-channel TFT 201, the conductive layer having the second tapered shape functions as its gate electrode 221. Moreover, the TFT 201 has the structure in which there are provided within the island-shaped semiconductor layer 105, a channel forming region 208, a first impurity region 209a to function as a source or drain region, a second impurity region (A) 209b for forming an LDD region not overlapping with the gate electrode 221, and another second impurity region (B) 209c for forming an LDD region partially overlapping with the gate electrode 221. A channel length is set in the range from 2 to 7 μm, while an overlapping length of the second impurity region (B) 209c with the gate electrode 221 is set in the range from 0.1 to 0.3 μm. This overlapping length Lov is controlled through the thickness of the gate electrode 221 as well as an angle of the tapered portion. By forming such an LDD region in the n-channel TFT, a high electrical field to be otherwise generated in the vicinity of the drain region can be mitigated, so that hot carriers are prevented from being generated, thereby resulting in prevention of deterioration of the TFT.

The second p-channel TFT 202 in the driver circuit similarly has the conductive layer having the second tapered shape, which functions as its gate electrode 222. Moreover, the TFT 202 has the structure in which there are provided within the island-shaped semiconductor layer 106, a channel forming region 210, a third impurity region 211a to function as a source or drain region, a fourth impurity region (A) 211b for forming an LDD region not overlapping with the gate electrode 222, and another fourth impurity region (B) 211c for forming an LDD region partially overlapping with the gate electrode 222.

The second n-channel TFT 203 in the driver circuit has the conductive layer having the second tapered shape which functions as its gate electrode 223. Moreover, the TFT 203 has the structure in which there are provided within the island-shaped semiconductor layer 107, a channel forming region 212, a first impurity region 213a to function as a source or drain region, a second impurity region (A) 213b for forming an LDD region not overlapping with the gate electrode 223, and another second impurity region (B) 213c for forming an LDD region partially overlapping with the gate electrode 223. Similarly with the second n-channel TFT 201, an overlapping length of the second impurity region (B) 213c with the gate electrode 223 is set in the range from 0.1 to 0.3 μm.

The driver circuit is composed of logic circuits such as a buffer circuit, the shift register circuits or the like, as well as a sampling circuit formed of an analog switch, or the like. In FIG. 8B, the TFTs for forming these circuits are illustrated to have a single-gate structure in which only one gate electrode is provided between a pair of source and drain regions. However, a multigate structure in which a plurality of gate electrodes are provided between a pair of source and drain regions may also be used.

The pixel TFT 204 has the conductive layer having the second tapered shape which functions as its gate electrode 224. Moreover, the pixel TFT 204 has the structure in which there are provided within the island-shaped semiconductor layer 108, channel forming regions 214a and 214b, first impurity regions 215a and 217 to function as source or drain regions, a second impurity region (A) 215b for forming an LDD region not overlapping with the gate electrode 224, and another second impurity region (B) 215c for forming an LDD region partially overlapping with the gate electrode 224. An overlapping length of the second impurity region (B) 213c with the gate electrode 224 is set in the range from 0.1 to 0.3 μm. In addition, a storage capacitor is formed from a semiconductor layer extending from the first impurity region 217 and including a second impurity region (A) 219b, another second impurity region (B) 219c, and a region 218 into which no impurity elements for defining the conductivity type are added; an insulating layer formed on the same level as the gate insulating film having the third shape; and a conductive layer having the second tapered shaped.

Figure 14:
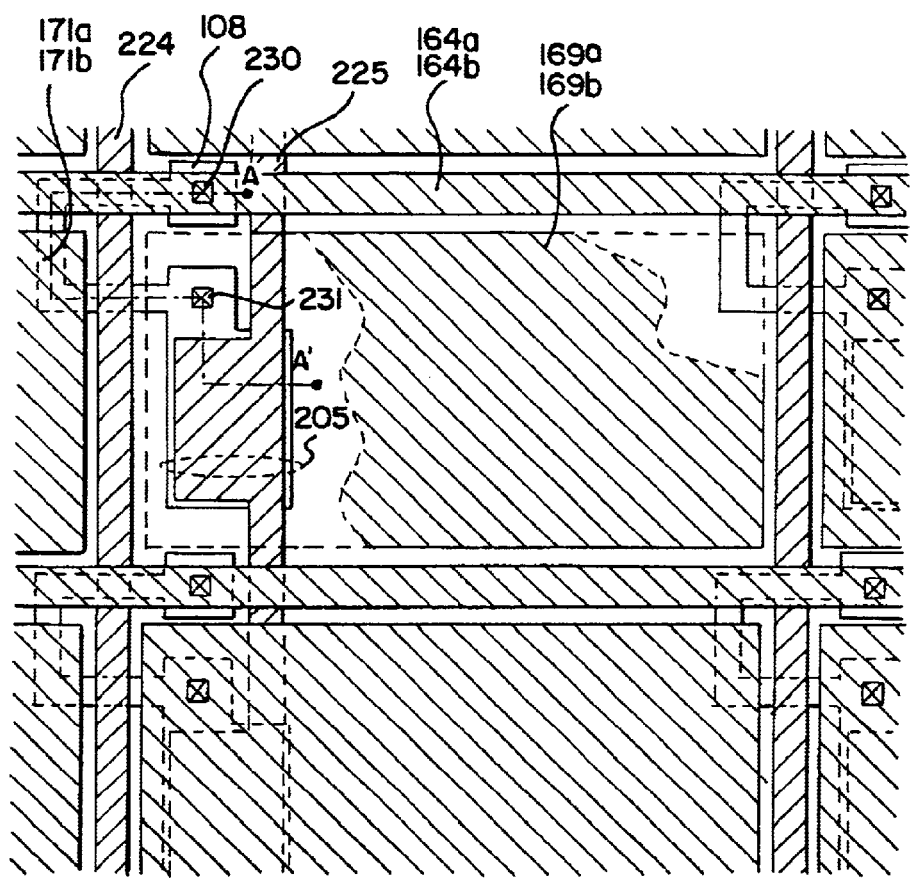
FIG. 14 is a top view of pixels in a pixel portion.

FIG. 14 shows a top view illustrating substantially the whole area corresponding to one pixel in the pixel portion. The cross-sectional view of the pixel portion shown in FIG. 8B is taken along the line A–A' indicated in FIG. 14. The gate electrode 224 crosses the underlying island-shaped semiconductor layer 108 via a gate insulating film (not illustrated), and further extends over a plurality of the island-shaped semiconductor layers so as to also function as the gate wiring. Although not illustrated, in the island-shaped semiconductor layer, the source region, the drain region, and the LDD region, as described with reference to FIG. 8B, are provided. In addition, reference numeral 230 designates a contact portion between a source wiring 164 and the source region 215a, while 231 designates a contact portion between the pixel electrode 169 and the drain region 227. The retaining capacitance 205 is formed in the region in which a semiconductor layer extending from the drain region 227 of the pixel TFT 204 overlaps with a capacitance wiring 225 via the gate insulating layer. In the above structure, no impurity elements intended for controlling valence electrons are added into the semiconductor layer 218.

The above-described structure allows the structures of the respective TFTs to be optimized based on requirements required in the pixel TFT and the driver circuit, and further allows the operating performances and the reliability of the semiconductor device to be improved. Moreover, by forming a gate electrode with a conductive material having the sufficient heat-resistance capability, activation of the LDD region or the source/drain regions can be easily performed. Furthermore, by forming the LDD region with a gradient in the concentration of impurity elements added for the purpose of controlling the conductivity type when forming the LDD region overlapping with the gate electrode via the gate insulating film, an effect of mitigating an electrical field, especially in the vicinity of the drain region, can be expected to be enhanced.

Figure 12A:
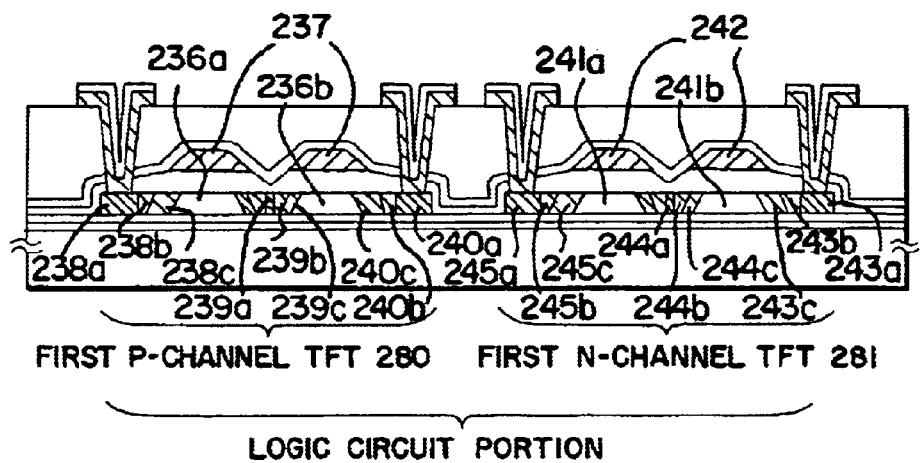
FIGS. 12A and 12B are sectional views showing the structure of a driver circuit TFT.

In the case of the active matrix liquid crystal display device, the first p-channel TFT 200 and the first n-channel TFT 201 are used for forming circuits required to operate at a high speed, such as a shift register circuit, a buffer circuit, or a level shifter circuit. In FIG. 8B, these circuits are expressed as a logic circuit portion. The second impurity region (B) 209c of the first n-channel TFT 201 has a structure in which the countermeasure against hot carriers is emphasized. Moreover, in order to improve breakdown characteristics and stabilize operations, the TFT in the logic circuit portion may be formed of the first p-channel TFT 280 and the first n-channel TFT 281, as shown in FIG. 12A. This TFT has a double-gate structure in which two gate electrodes are provided between a pair of source/drain regions, and can be similarly fabricated in accordance with the fabrication process in the present embodiment. The first p-channel TFT 280 has in the island-shaped semiconductor layer, channel forming regions 236a and 236b, third impurity regions 238a, 239a, 240a to function as source or drain regions, fourth impurity regions (A) 238b, 239b, 240b for forming LDD regions, and other fourth impurity regions (B) 238c, 239c, 240c for partially overlapping with the gate electrode 237 to form LDD regions. The first n-channel TFT 281 has in the island-shaped semiconductor layer, channel forming regions 241a and 241b, first impurity regions 243a, 244a, 245a to function as source or drain regions, second impurity regions (A) 243b, 244b, 245b for forming LDD regions, and other second impurity regions (B) 243c, 244c, 245c for forming LDD regions partially overlapping with the gate electrode 242. A channel length is set on the range from 3 to 7 μm, and an overlapping length Lov in the channel length direction of the LDD region overlapping with the gate electrode is set in the range from 0.1 to 0.3 μm.

Figure 12B:
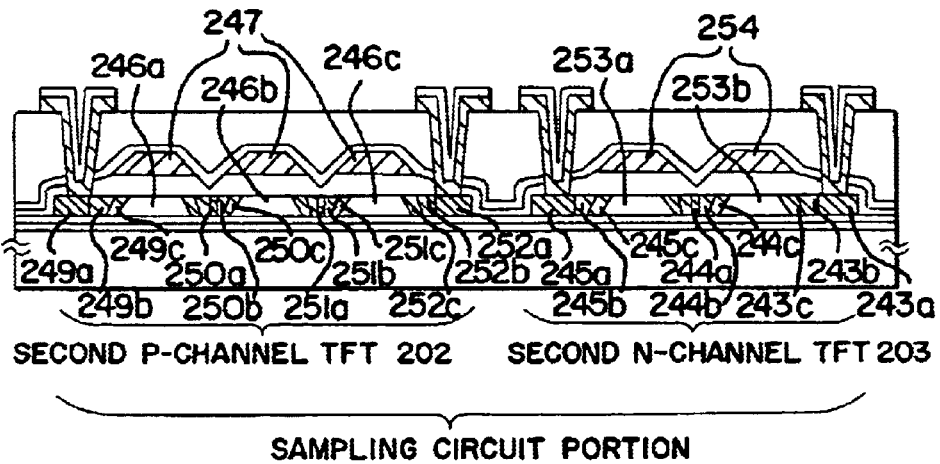

In the sampling circuit composed of the analog switches, the second p-channel TFT 202 and the second n-channel TFT 203 having the similar structures can be applied. Since the countermeasure against hot carriers, as well as realization of a low OFF current operation, are important for the sampling circuit, these TFTs in the sampling circuit may be formed of the second p-channel TFT 282 and the second n-channel TFT 283, as shown in FIG. 12B. The second p-channel TFT 282 has a triple-gate structure in which three gate electrodes are provided between a pair of source/drain regions, and can be similarly fabricated in accordance with the fabrication process in the present embodiment. The second p-channel TFT 282 has in the island-shaped semiconductor layer, channel forming regions 246a, 234b, and 246c, third impurity regions 249a, 250a, 251a, and 252a to function as source or drain regions, fourth impurity regions (A) 249b, 250b, 251b, and 252b for forming LDD regions, and other fourth impurity regions (B) 249c, 250c, 251c, and 252c for partially overlapping with the gate electrode 247 to form LDD regions. The second n-channel TFT 283 has in the island-shaped semiconductor layer, channel forming regions 253a and 253b, first impurity regions 255a, 256a, 257a to function as source or drain regions, second impurity regions (A) 255b, 256b, 257b for forming LDD regions, and other second impurity regions (B) 255c, 256c, 257c for partially overlapping with the gate electrode 254 to form LDD regions. A channel length is set in the range from 3 to 7 μm, and an overlapping length Lov in the channel length direction of the LDD region overlapping with the gate electrode is set in the range from 0.1 to 0.3 μm.

Thus, whether the gate electrode of the TFT should be a single-gate structure or a multigate structure in which a plurality of gate electrodes are provided between a pair of source/drain regions, may be appropriately selected depending on the required characteristics of the circuit. By employing the active matrix substrate completed in accordance with the present embodiment, a reflection-type liquid crystal display device can be fabricated.

Embodiment 7

Embodiment 6 has shown an example in which a heat-resistant conductive material, such as W or Ta is used as the material of the gate electrode. Such material is chosen because it is necessary to activate through thermal annealing of 400 to 700° C. the impurity element used for doping the semiconductor layer to control conductivity after the gate electrode is formed, which requires the gate electrode to have heat resistance. However, such heat-resistant conductive material is on the order of 10Ω in resistance per unit area, and is not so suitable for a display device having a 4 inch screen or larger. If a gate line connected to the gate electrode is formed of the same material as the gate electrode, the length of the lead out line on the substrate is naturally increased to cause a measurable problem of wiring delay due to the wiring resistance.

For instance, 480 gate wirings and 640 source wirings are formed in the case where the pixel density is VGA whereas 768 gate wirings and 1024 source wirings are formed in the case where the pixel density is XGA. The screen size of the display region is diagonally 340 mm if it is a 13 inch screen, and 460 mm if it is an 18 inch screen. This embodiment gives a description with reference to FIGS. 9A and 9B on a method of forming the gate wiring of a low-resistive conductive material such as Al or copper (Cu) as a measure for realizing a liquid crystal display device as above.

First, steps shown in FIGS. 6A to 7C are carried out as in Embodiment 6. Then the impurity elements used to dope the respective island-like semiconductor layers in order to control the conductivity are activated. This activation step employs thermal annealing that uses an annealing furnace. Other than thermal annealing, laser annealing or rapid thermal annealing (RTA) can be employed. The thermal annealing is conducted at a temperature of 400 to 700° C., typically, 500 to 600° C., in nitrogen atmosphere in which oxygen concentration is 1 ppm or less, preferably, 0.1 ppm or less. In this embodiment, heat treatment is performed at 500° C. for four hours.

Through the heat treatment, conductive layers (C) 172a to 172f are formed to a thickness of 5 to 80 nm on the surfaces of the conductive layers 140 to 145 having the second taper shape. For example, tungsten nitride is formed when the conductive layers having the second taper shape are made of W, whereas tantalum nitride is formed when they are made of Ta. Further heat treatment is conducted at 300 to 450° C. in atmosphere containing 3 to 100% hydrogen for an hour to twelve hours to thereby hydrogenate the island-like semiconductor layers. This hydrogenation step is to terminate dangling bonds in the semiconductor layers by thermally excited hydrogen. Other hydrogenating measures include plasma hydrogenation (using hydrogen excited by plasma). (FIG. 9A)

After the activating and hydrogenating treatment, the gate line will be formed from a low-resistive conductive material. The low-resistive conductive material mainly contains Al or Cu, and a low-resistive conductive layer formed of this material is used to form the gate line. For example, an Al film containing 0.1 to 2 wt % of Ti is formed as the low-resistive conductive layer on the entire surface (not shown). The thickness of the low-resistive conductive layer is 200 to 400 nm (preferably, 250 to 350 nm). A given resist pattern is formed on the layer, and the layer is etched in accordance with the pattern to form gate lines 173 and 174. A capacitor line 175 to be connected to a capacitor storage provided in the pixel portion is formed simultaneously from the same material as the gate lines. When the low-resistive conductive layer is formed of a material mainly containing Al, the gate lines can be formed by wet etching using a phosphoric-acid based etchant while maintaining selective processing with respect to the base film. A first interlayer insulating film 176 is formed by a process similar to Embodiment 6. (FIG. 9B)

Figure 10A:
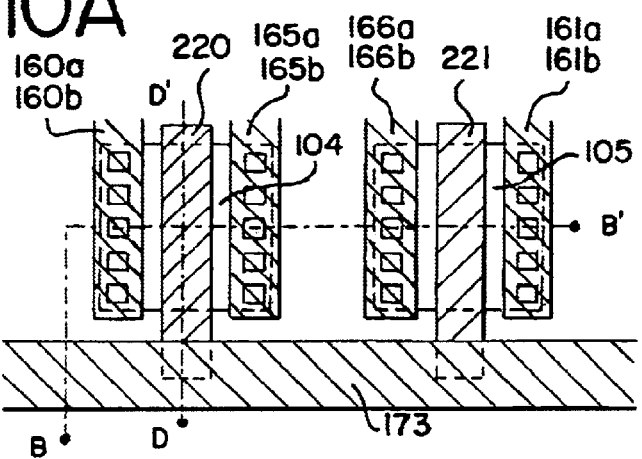
FIGS. 10A and 10B are top views showing the structure of a driver circuit TFT and a pixel TFT.
Figure 10B:
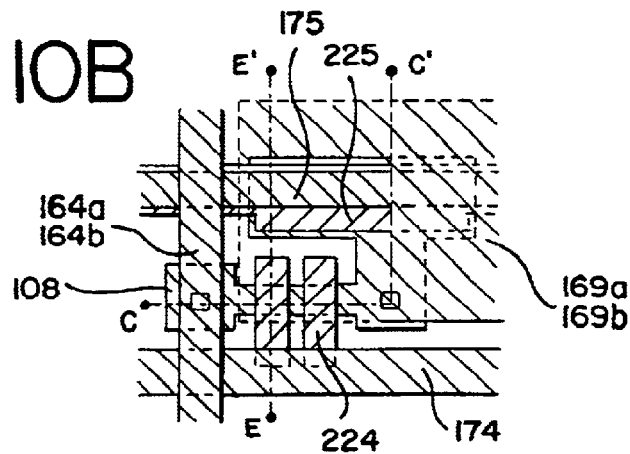
Figure 11A:
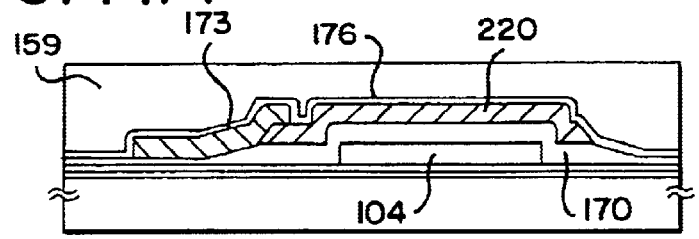
FIGS. 11A and 11B are sectional views showing the structure of the driver circuit TFT and the pixel TFT.
Figure 11B:
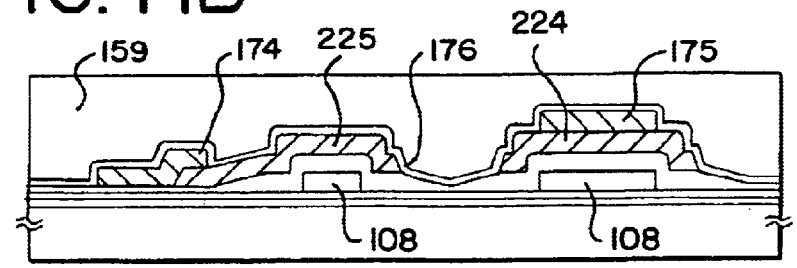

Thereafter formed similar to Embodiment 6 are a second interlayer insulating film 159 made of an organic insulating material, source lines 160 to 164, drain lines 165 to 168, and pixel electrodes 169 and 171. An active matrix substrate is thus completed. FIGS. 10A and 10B show the top view of the completed active matrix substrate. A sectional view taken along the line B–B' of FIG. 10A and a sectional view taken along the line C–C' of FIG. 10B correspond to the view cut along the line B–B' of FIG. 8C and the view cut along the line C–C' of FIG. 8C, respectively. The gate insulating film, the first interlayer insulating film, and the second interlayer insulating film are omitted from FIGS. 10A and 10B. However, source and drain regions (not shown) of the island-like semiconductor layers 104, 105 and 108 have contact holes formed therein and the pixel electrode 169 is connected with the source lines 160, 161, and 164 and the drain lines 165 and 166 through the contact holes. A sectional view taken along the line A–A' of FIG. 10A and a sectional view taken along the line E–E' of FIG. 10B correspond to FIGS. 11A and 11B, respectively. The gate lines 173 and 174 are formed such that the gate line 173 overlaps with the gate electrode 220 outside the island-like semiconductor layer 104 and the gate line 174 overlaps with the gate electrode 225 outside the island-like semiconductor layer 108. The gate electrodes are in contact with and electrically connected with the low-resistive conductive layers without a help of the contact holes. By thus forming a gate line from a low-resistive conductive material, the wiring resistance can be lowered enough. The active matrix substrate can accordingly be applied to a display device having a 4 inch screen (pixel portion) or larger.

Embodiment 8

The active matrix substrate manufactured in Embodiment 6 is applicable for a reflection type liquid crystal display device as is. On the other hand, in the case of applying it to a transmission type liquid crystal display device, then it is appropriate to form the pixel electrodes provided in each pixel of the pixel portion with transparent electrodes. A method of manufacturing an active matrix substrate corresponding to the transmission type liquid crystal display device is explained in Embodiment 8 with references to FIGS. 13A to 13D.

Figure 13A:
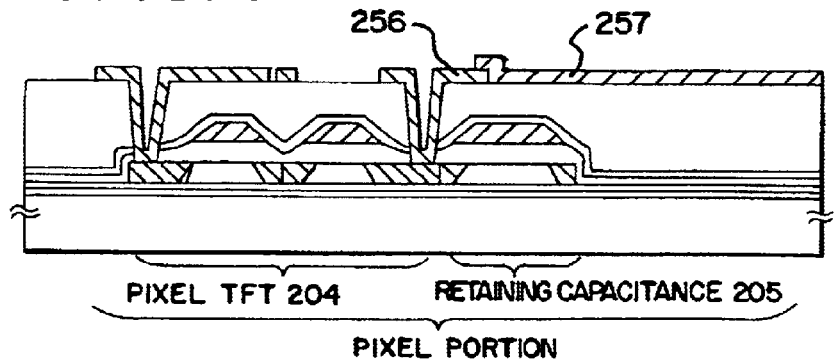
FIGS. 13A to 13D are sectional views showing the structure of a pixel TFT.
Figure 13B:
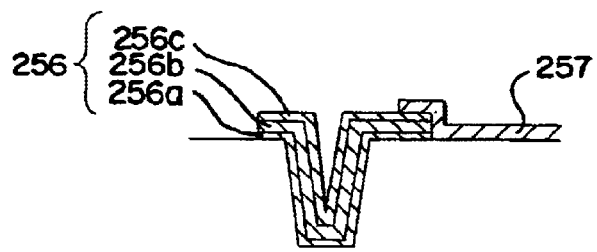

The active matrix substrate is manufactured in the same way as Embodiment 6. In FIG. 13A, a conductive metallic film is formed by sputtering or vacuum evaporation to form a source wiring and a drain wiring. This structure will be explained in detail with reference to FIG. 13B using the drain wiring 256 as an example. A Ti film 256a is formed at a thickness of between 50 and 150 nm, and then a contact is formed with a semiconductor film that forms the source or the drain region in an island semiconductor layer. Next an aluminum (Al) film 256b is formed at a thickness of between 300 and 400 nm overlapping on the Ti film 256a. Further, a Ti film 256c or a titanium nitride (TiN) film is formed at a thickness of between 100 and 200 nm to thereby form a three-layer structure. Then a transparent conductive film is formed on the entire surface. Pixel electrodes 257 are formed by a patterning process and an etching process, using a photomask. The pixel electrode 257 is formed on a second interlayer insulating film made of an organic resin material and sets aside a portion for overlapping with the drain wiring 256 of the pixel TFT 204 in order to form an electrical connection.

Figure 13C:
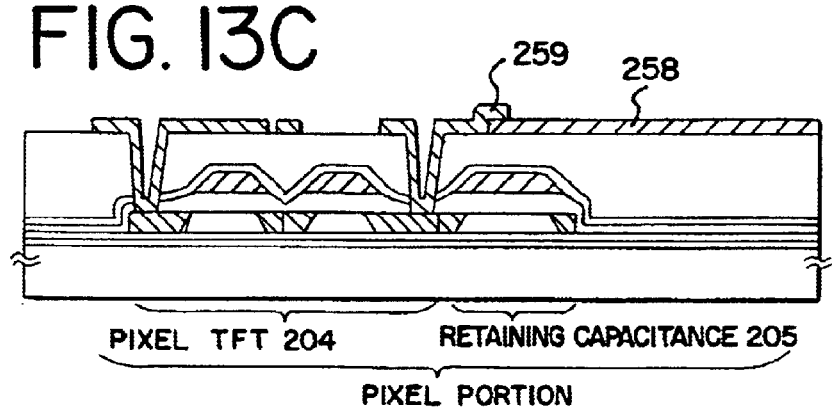
Figure 13D:
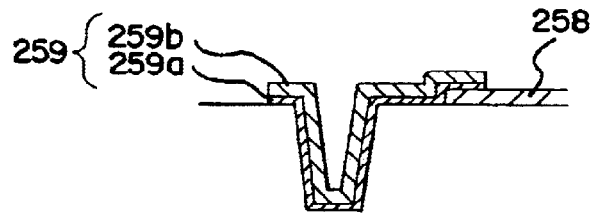

FIG. 13C is an example of first forming a transparent conductive film on the second interlayer insulating film, performing a patterning process and an etching process to form a pixel electrode 258, and then forming a drain wiring 259 by a portion that overlaps with the pixel electrode 258. As shown in FIG. 13D, the drain wiring 259 is provided by forming a Ti film 259a at a thickness of between 50 and 150 nm, forming a contact hole with a semiconductor film that forms the source or the drain region in an island semiconductor layer, and then forming an aluminum film 259b at a thickness between 300 and 400 nm overlapping on the Ti film 259a. With this structure, the pixel electrode 258 is in contact only with the Ti film 259a that forms the drain wiring 259. Consequently, the transparent conductive film material and Al reacting from direct contact can definitely be prevented.

Materials such as indium oxide ($In_2O_3$), or an indium oxide/tin oxide alloy ($In_2O_3$—$SnO_2$; ITO) formed by sputtering or vacuum evaporation may be used as materials for the transparent conductive film. The etching treatment of this type of material is performed with hydrochloric acid solutions. However, in particular, the etching of ITO readily generates residues. Therefore, an indium oxide/zinc oxide alloy ($In_2O_3$—$ZnO$) may be used in order to improve the etching workability. The indium oxide/zinc oxide alloy has excellent flat and smooth surface properties, and also has excellent thermal stability in regards to ITO. Accordingly, in the structure of FIGS. 20A and 20B, at an edge surface of a drain wiring 256 where the Al film 256b comes into contact with the pixel electrode 257, corrosion reaction with Al can be prevented. Similarly, zinc oxide (ZnO) is also a suitable material. In order to further improve the transmissivity of visible light and conductivity, zinc oxide doped with gallium (Ga) (ZnO:Ga), etc. may be used.

In Embodiment 6, an active matrix substrate that can be used for manufacturing the reflection type liquid crystal display device was fabricated by using 5 photomasks. The addition of one more photomask (a total of 6 photomasks) can thus complete an active matrix substrate corresponding to the transmission type liquid crystal display device. Though the steps described in this embodiment are similar to those in Embodiment 6, this kind of structure can be applied to the active matrix substrate shown in Embodiment 7.

Embodiment 9

A method of manufacturing an active matrix liquid crystal display device from the active matrix substrate fabricated in Embodiment 6 will be explained here in this Embodiment. As shown in FIG. 15A, first a spacer made from a column-shape spacer is formed on the active matrix substrate in the state of FIG. 8B. The spacer may be provided by a method of spraying several mm of grains. A method of forming the spacer by patterning after forming a resin film on the entire surface of the substrate is adopted here in this embodiment. The material for such kind of spacer is not limited. For example, using the JSR product NN700, after application to the substrate by a spinner, a predetermined pattern is formed by exposure and development treatment. Furthermore, it is cured by being heated in a clean oven at 150° C. to 200° C. The shape of the spacer formed in this way may be made different depending on the conditions of the exposure and development treatment. The spacer is formed so that its shape becomes a column-shape with a flat top, which is a preferred shape because when an opposing substrate is bonded to this substrate, its mechanical strength as a liquid crystal display panel can be ensured. The shape of the spacer such as a conical shape or a pyramid shape is not specially limited thereto. For example, when the spacer is a conical shape, its specific measurements are as follows: the height H is set between 1.2 and 5 mm, the average radius L1 is set between 5 and 7 mm, and the ratio of the average radius L1 and the radius of the bottom portion L2 is set to 1 to 1.5. The taper angle of the side surface at this point is ±15° or less.

The arrangement of the column-shape spacers may be arbitrarily determined, but preferably it is appropriate to form a column-shape spacer 406 overlapping the contact area 231 of the pixel electrode 169 in the pixel portion so as to cover that overlapped portion as shown in FIG. 15A. Liquid crystal cannot be smoothly oriented in a portion where the levelness of the contact area 231 has been ruined. Hence, the column-shape spacer 406 is formed as in the form of filling the contact area 231 with resin used for the spacer, whereby disclination or the like can be prevented. In addition, spacers 405a to 405e are formed on the TFT of the driver circuit. These spacers may be formed extending over the entire surface of the driver circuit portion, and may also be formed so as to cover the source wiring and the drain wiring as shown in FIGS. 15A and 15B.

Thereafter, an alignment film 407 is formed. A polyimide resin is often used for the alignment film of a liquid crystal display element. After forming the alignment films, a rubbing process is performed so that the liquid crystal molecules are oriented with a certain fixed pre-tilt angle. The rubbing process is performed such that an area of 2 mm or less from the edge portion of the column-shape spacer 406 provided in the pixel portion to the rubbing direction, is not rubbed. Further, since the generation of static electricity from the rubbing process is often a problem, an effect of protecting the TFT from the static electricity can be attained by forming the spacers 405a to 405e on the TFT of the driver circuit. Although not described in the figures, the substrate may have a structure in which the alignment film 407 is formed before forming the spacers 406 and 405a to 405e.

A light shielding film 402, a transparent conductive film 403, and an alignment film 404 are formed on an opposing substrate 401, which is opposed to the active matrix substrate. The light shielding film 402 is formed of films such as a Ti film, a Cr film, and an Al film at a thickness of between 150 and 300 nm. The active matrix substrate, on which the pixel portion and the driver circuit are formed, and the opposing substrate are then joined together by a sealing agent 408. A filler (not shown in the figures) is mixed into the sealing agent 408, and the two substrates are joined together with a uniform spacing by the filler and the spacers 406 and 405a to 405e. Next, a liquid crystal material 409 is injected between both substrates. A known liquid crystal material may be used as the liquid crystal material. For example, besides the TN liquid crystal, a thresholdless antiferroelectric mixed liquid crystal that indicates electro-optical response characteristics of continuously changing transmittance with respect to an electric field may also be used. Among such thresholdless antiferroelectric mixture liquid crystal, there is a type that indicates a V-shaped electro-optical response characteristic. In this way the active matrix type liquid crystal display device shown in FIG. 15B is completed.

Figure 16:
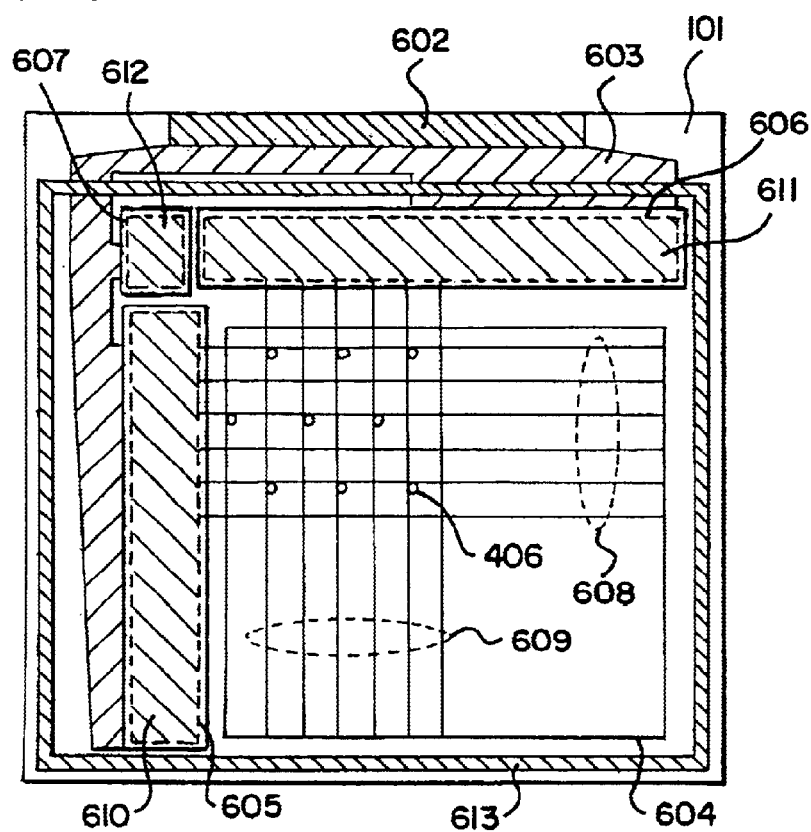
FIG. 16 is a top view illustrating the arrangement of an input/output terminal, a wiring, circuits, a spacer, and a sealing agent in a liquid crystal display device.

FIG. 16 is a top view showing this type of active matrix substrate and the positional relation of the pixel portion and the driver circuit portion versus the spacers and the sealing agent. A scanning signal driver circuit 605 and an image signal driver circuit 606 as driver circuits are provided in the periphery of a pixel portion 604 on the glass substrate 101 described in Embodiment 6. In addition, a signal processing circuit 607 such as a CPU or a memory circuit may also be added. Then these driver circuits are connected to an external input/output terminal 602 by a connecting wiring 603. In the pixel portion 604, a set of gate wirings 608 extending from the scanning signal driver circuit 605 and a set of source wirings 609 extending from the image signal driver circuit 606 intersect in matrix to form pixels. Each pixel is provided with the pixel TFT 204 and the storage capacitor 205.

In FIG. 15 the column-shape spacer 406 provided in the pixel portion may be provided not only to each pixel, but also to every several pixels or several tens of the pixels arranged in a matrix manner as shown in FIG. 16. In other words, it is possible to set the ratio of the total number of pixels composing the pixel portion to the number of spacers between 20% and 100%. In addition, the spacers 405a to 405e provided in the driver circuits portion may be formed so as to cover the entire surface of the circuits, or may be provided in accordance with the position of the source wiring and the drain wiring of each TFT. In FIG. 16, reference numerals 610 to 612 denote the arrangement of the spacers provided in the driver circuits portion. In FIG. 16, the sealing agent 619 is formed on the exterior of the pixel portion 604, the scanning signal driver circuit 605, the image signal driver circuit 606, and the signal processing circuit 607 of the other circuits, and on the interior of an external input/output terminal 602, that are formed over the substrate 101.

Figure 17:
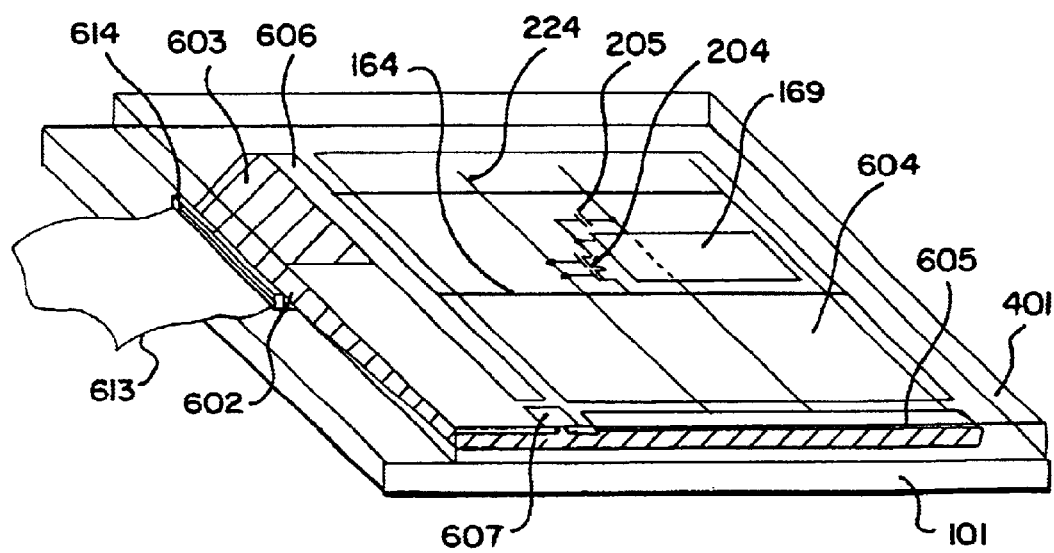
FIG. 17 is a perspective view showing the structure of the liquid crystal display device.

Next, the structure of this kind of active matrix liquid crystal display device is explained using the perspective view of FIG. 17. In FIG. 17, the active matrix substrate comprises the pixel portion 604, the scanning signal driver circuit 605, the image signal driver circuit 606, and the signal processing circuit 607 of the other circuits formed over the glass substrate 101. The pixel TFT 204 and the storage capacitor 205 are provided in the pixel portion 604, and the driver circuit formed in the periphery thereof is structured based on a CMOS circuit. The scanning signal driver circuit 605 and the image signal driver circuit 606 are connected to the pixel TFT 204 by the gate wiring (in the case which is formed continuously to the gate electrode, the gate wiring corresponds to the numeral 224 of FIG. 8B) and the source wiring 164, respectively, extending to the pixel portion 604. Further, an FPC (flexible print circuit) 613 is connected to the external input/output terminal 602 to be utilized for inputting signals such as image signals. The FPC 613 is firmly adhered in this area by a strengthening resin 614. The connecting wiring 603 is connected to the respective driver circuits. Further, though not shown in the figure, a light shielding film and a transparent conductive film are provided on the opposing substrate 401.

A liquid crystal display device with this kind of structure can be formed by using the active matrix substrate described in Embodiments 6 to 8. The reflection type liquid crystal display device can be attained with employment of the active matrix substrate shown in Embodiment 6 whereas the transmission type liquid crystal display device can be attained with employment of the active matrix substrate shown in Embodiment 8.

Embodiment 10

Figure 18:
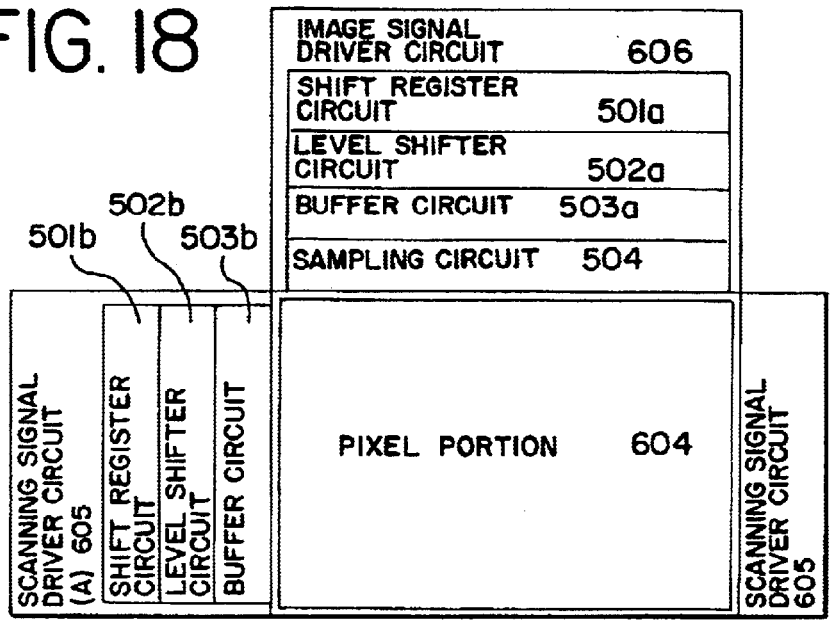
FIG. 18 is a block diagram illustrating the circuit structure of an active matrix display device.

FIG. 18 illustrates an example of the circuit structure of the active matrix substrate described in Embodiments 6 to 8, and shows the circuit structure of a direct-view type display device. This active matrix substrate is composed of the image signal driver circuit 606, the scanning signal driver circuits (A) and (B) 605, and the pixel portion 604. Note that the driver circuit stated throughout the present specification is a generic term including the image signal driver circuit 606 and the scanning signal driver circuit 605.

The image signal driver circuit 606 comprises a shift register circuit 501a, a level shifter circuit 502a, a buffer circuit 503a, and a sampling circuit 504. In addition, the scanning signal driver circuits (A) and (B) 185 comprises a shift register circuit 501b, a level shifter circuit 502b, and a buffer circuit 503b.

The driving voltages of the shift register circuits 501a and 501b are between 5 and 16V (typically 10V). A TFT of a CMOS circuit for forming this circuit is formed of the first p-channel TFT 200 and the first n-channel TFT 201 of FIG. 8B, or the TFT may be formed of the first p-channel TFT 280 and the first n-channel TFT 281 shown in FIG. 12A. In addition, since the driving voltage of the level shifter circuits 502a and 502b and the buffer circuits 503a and 503b become as high as 14 to 16V, it is preferable that the TFT structure be formed into a multi-gate structure as shown in FIG. 12A. Forming the TFT into a multi-gate structure is effective in raising voltage-resistance and improving the reliability of the circuits.

The sampling circuit 504 comprises an analog switch and its driving voltage is between 14 to 16V. Since the polarity alternately reverses to be driven and there is a necessity to reduce the Off current value, it is desired that the sampling circuit 504 be formed of the second p-channel TFT 202 and the second n-channel TFT 203 as shown in FIG. 8B. Alternatively, the sampling circuit may be formed of the second p-channel TFT 282 and the second n-channel TFT 283 of FIG. 12B in order to effectively reduce the Off current value.

Further, the driving voltage of the pixel portion is between 14 and 16V. From a viewpoint of reducing power consumption, there is a demand to further reduce the Off current value than that of the sampling circuit. Accordingly, as a basic structure, the pixel portion is formed into a multi-gate structure as the pixel TFT 204 shown in FIG. 8B.

Note that the structure of this Embodiment can be readily realized by manufacturing the TFT in accordance with the steps shown in Embodiments 6 through 8. The structures of the pixel portion and the driver circuits only are shown in this embodiment. Other circuits such as a signal divider circuit, a frequency dividing circuit, a D/A converter, a γ correction circuit, an operational amplifier circuit, and further signal processing circuits such as a memory circuit and an operation processing circuit, and still further a logic circuit, may all be formed on the same substrate in accordance with the processes of Embodiments 6 through 8. In this way, the present invention can realize a semiconductor device comprising a pixel portion and a driver circuit thereof on the same substrate, for example, a liquid crystal display device equipped with a signal controlling circuit and a pixel portion.

Embodiment 11

In this embodiment, an example will be described where a display panel made from an EL (Electro Luminescence) material in a self-emitting type (hereinafter described as EL display device) is formed as a light-emitting device using an active matrix substrate formed according to the above mentioned Embodiment 10. The light-emitting device (EL display device) is for example OLED (Organic Light Emission Diode). The EL (electroluminescent) devices referred to in this specification include triplet-based light emission devices and/or singlet-based light emission devices, for example.

In this specification, a light emitting device is a generic term referring to a display panel having a light emitting element formed on a substrate and sealed between the substrate and a cover member as well as a display module in which an IC is mounted to the display panel. The light emitting element is composed of a layer containing an organic compound that provides electro luminescence generated by applying electric field thereto (light emitting layer), an anode layer, and a cathode layer. The luminescence generated from an organic compound is classified into light emission upon returning to base state from singlet excitation (fluorescence) and light emission upon returning to base state from triplet excitation (phosphorescence). The light emitting device of the present invention is capable of one or both types of the light emission.

Figure 19A:
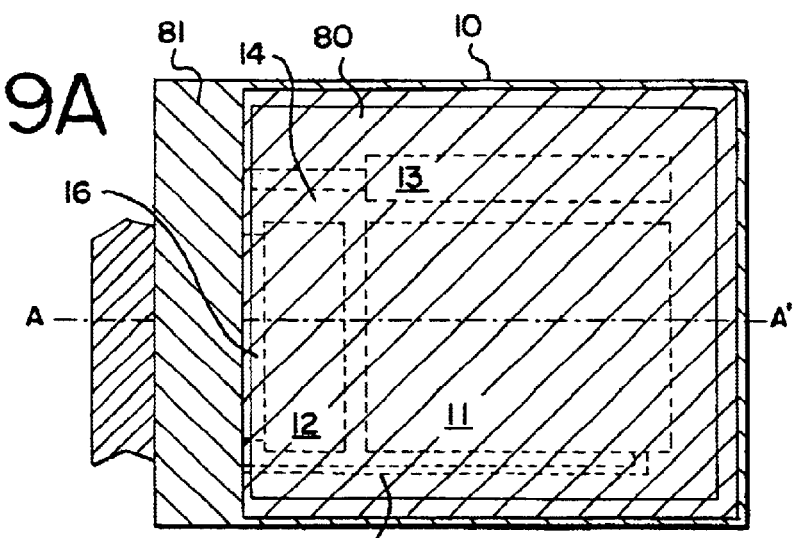
FIGS. 19A and 19B are, respectively, a top view and a sectional view which show the structure of an EL display device.

FIG. 19A is a top view of an EL display panel using the present invention. In FIG. 20A, reference numeral 10 denotes a substrate, 11 denotes a pixel portion, 12 denotes a source-side driver circuit, and 13 denotes a gate-side driver circuit. Each driver circuit is connected to an FPC 17 through wirings 14 to 16 so as to be connected to external equipment.

Figure 19B:
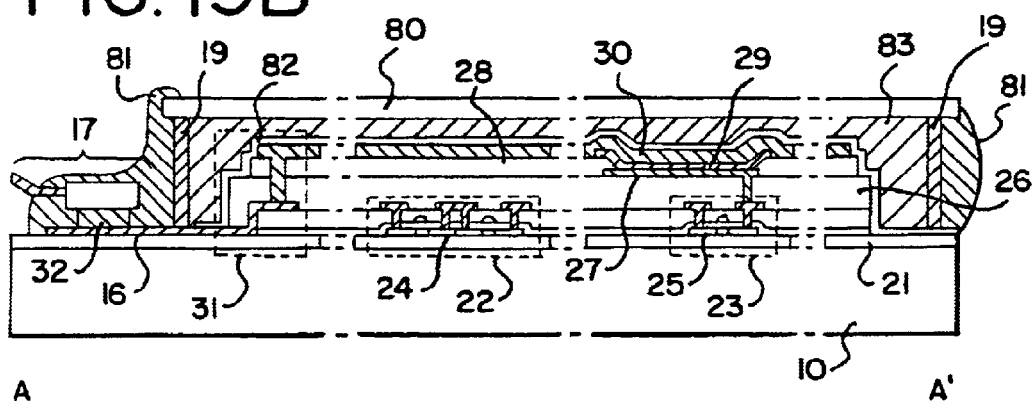

FIG. 19B shows a sectional structure of A–A' of FIG. 19A. The counter substrate 80 is provided at least on the pixel portion, preferably the driver circuits and the pixel portion. The counter substrate 80 is attached to the active matrix substrate, on which TFTs and an EL layer are formed with a sealant 19. The sealant 19 is mixed with a filler (not shown in the figure), two substrate are attached together with the filler at equal spaces. Further, the outside of the sealant 19 and the top surface and the periphery portion of FPC 17 has a structure of being filled up by the sealant 81. As materials of the sealant 81, silicone resin, epoxy resin, phenol resin and butyl rubber are used.

As it is, the active matrix substrate 10 and the counter substrate 80 are attached together with a sealant 19, space is generated therebetween. A filler 83 is filled with the space. The filler 83 has an effect of attachment of the counter substrate 80. The PVC (polyvinyl chloride), epoxy resin, silicone resin, PVB (polyvinyl butyral), and EVA (ethylene vinyl acetate) can be used as the filler 83. An EL layer is weak to moisture such as water and is likely to be degraded, so that it is preferable to mix a drying agent such as barium oxide in the filler 83 so as to keep an effect of moisture absorption. Further, a passivation film 82 is formed on the EL layer by the silicon nitride film and silicon oxynitride film to protect from corrosion by alkali element which contains in the filler 83.

A glass plate, an aluminum plate, a stainless steel plate, an FRP (fiberglass-reinforced plastics) plate, a PVF (polyvinyl fluoride) film, a Mylar film (a product of DUPONT Corp.), a polyester film, and an acrylic film or acrylic plate can be used as the counter substrate 80. A sheet having a structure in which several ten $\mu$m thick aluminum foil is interposed between a substrate and a PVF film or between the substrate and a Mylar film, is used to enhance resistance to moisture. In this manner, the EL element is completely sealed and is not exposed to the outside of air.

In FIG. 19B, the TFT 22 for a driver circuit (CMOS circuit which is composed of n-channel type TFT and p-channel type TFT is shown here), and the TFT 23 for a pixel portion (only TFT controlling current to an EL element is shown here) are formed on a substrate 10 and a base film 21. Among these TFTs, in particular, n-channel TFT is provided with an LDD region having the structure shown in the present embodiment so as to prevent the decrease of ON current value and the Vth shift due to hot carrier, or the deterioration of the properties caused by bias stress.

For example, as the TFT 22 for a driver circuit, the p-channel TFTs 200, 202 or the n-channel TFTs 201, 203 shown in FIG. 8B may be used. Furthermore, as the TFT 23 for a pixel portion, a pixel TFT 204 shown in FIG. 8B or a p-channel TFT having a similar structure can be used.

To manufacture the EL display device from an active matrix substrate in a state of FIG. 8B or FIG. 9C, an interlayer insulating film (a flattening film) 26 made of resin material, is formed on the source line and the drain line, and a pixel electrode 27 made of a transparent conductive film, which is connected electrically to drain of the TFT 23 for a pixel portion, is formed thereon. As a transparent conductive film, a compound of indium oxide and tin oxide (which is called as ITO), and a compound of indium oxide and zinc oxide can be used. After forming the pixel electrode 27, an insulating film 28 is formed, and an opening portion is formed on the pixel electrode 27.

Next, an EL layer 29 is formed. The EL layer 29 may have a lamination structure including an appropriate combination of layers made of known EL materials (hole injection layer, hole transporting layer, light-emitting layer, electron transportation layer, or electron injection layer) or a single structure. Such a structure can be obtained by a known technique. Furthermore, examples of the EL material include a low molecular-weight material and polymer material. In the case of using a low molecular-weight material, vapor deposition is used. In the case of using a polymer material, a simple method such as spin coating, printing, and an ink jet method can be used.

In this embodiment, the EL layer is formed by vapor deposition, ink jet method or dispenser method using a shadow mask. By forming light-emitting layers (red light-emitting layer, green-light emitting layer, and blue light-emitting layer) capable of emitting light with different wavelengths on respective pixels, a color display can be performed. In addition, a combination of a color conversion layer (CCM) and a color filter, or a combination of a white light-emitting layer and a color filter may be used. Needless to say, an EL display device emitting single color light can also be used.

When the EL layer 29 is formed, a cathode 30 is formed thereon. It is desirable to remove moisture and oxygen present at an interface between the cathode 30 and the EL layer 29 as much as possible. Thus, it is required to continuously form the EL layer 29 and the cathode 30 in a vacuum, or to form the EL layer 29 in an inactive atmosphere, and form the cathode 30 in a vacuum without exposing the EL layer 29 to the outside air. In this embodiment, a film formation device of a multi-chamber system (cluster tool system) is used to make the above mentioned film formation possible.

In this embodiment, as the cathode 30, a lamination structure of a LiF (lithium fluoride) film and an Al (aluminum) film is used. More specifically, the LiF film is formed to a thickness of 1 nm on the EL layer 29 by vapor deposition, and an Al film is formed to a thickness of 300 nm thereon. It is appreciated that a MgAg electrode that is a known negative electrode material may be used. The cathode 30 is connected to the wiring 16 in a region denoted by reference numeral 31. The wiring 16 is a power supply line for supplying a predetermined voltage to the cathode 30, and is connected to the FPC 17 via anisotropic conductive paste material 32. A resin layer 80 is further formed on the FPC 17 so as to enhance adhesiveness in this portion.

In order to electrically connect the cathode 30 to the wiring 16 in the region 31, it is required to form contact holes in the interlayer insulating film 26 and the insulating film 28. The contact holes may be formed during etching of the interlayer insulating film 26 (during formation of a contact hole for a pixel electrode) or during etching of the insulating film 28 (during formation of an opening portion before forming the EL layer). Furthermore, when the insulating film 28 is etched, the interlayer insulating film 26 may also be etched together. In this case, if the interlayer insulating film 26 and the insulating film 28 are made of the same resin material, the shape of the contact holes can be made fine.

Furthermore, the wiring 16 is electrically connected to the FPC 17 through a gap between the sealant 19 and the substrate 10 (the gap is filled with a sealant 81). Herein, although description is made with respect to the wiring 16, other wirings 14 and 15 are also electrically connected to the FPC 17 through a gap between the sealant 81.

Figure 21A:
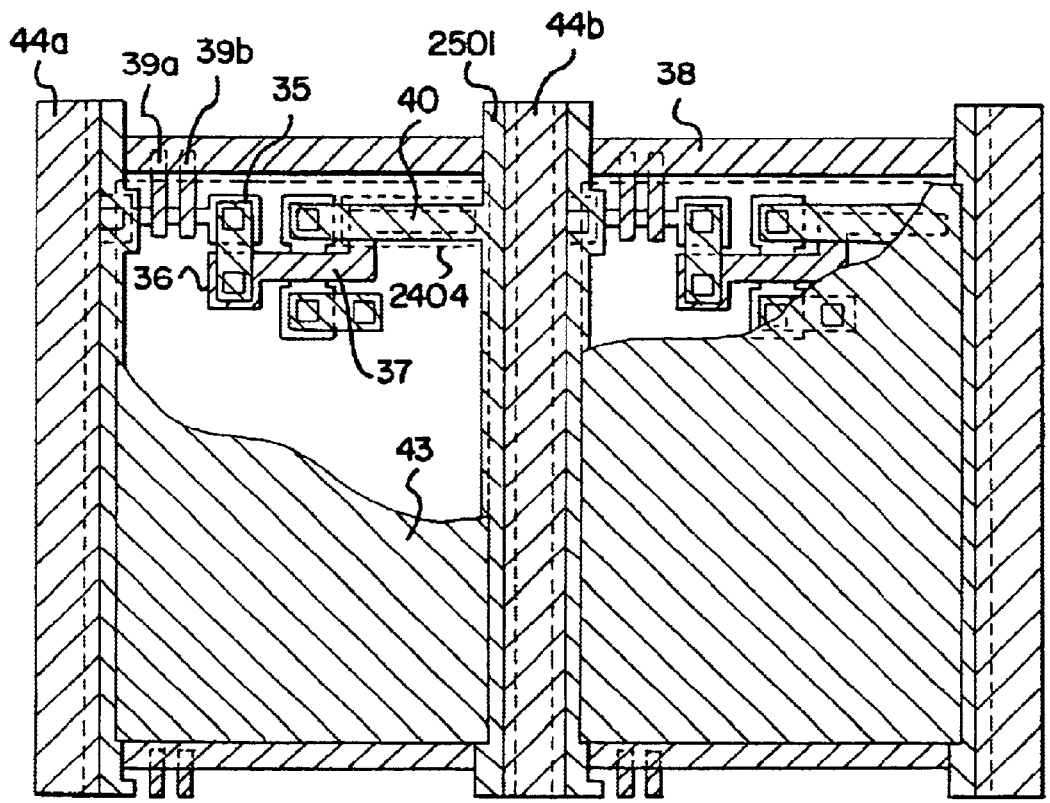
FIGS. 21A and 21B are a top view of a pixel portion of an EL display device and a circuit diagram thereof, respectively.
Figure 21B:
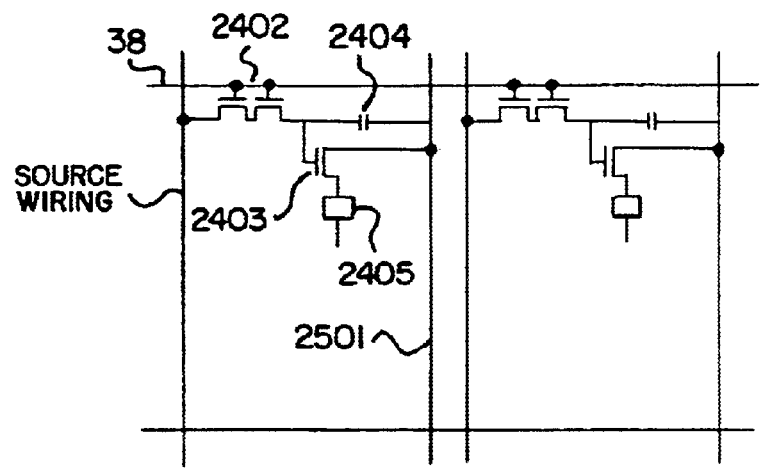

FIG. 20 shows a more detailed cross-sectional structure of the pixel portion. FIG. 21A shows a top view thereof, and FIG. 21B shows a circuit diagram thereof. In FIG. 20A, a switching TFT 2402 provided on a substrate 2401 is formed according to the same structure of the pixel TFT 204 shown in FIG. 8B of Embodiment 6. Due to the double-gate structure, there is an advantage in that substantially two TFTs are connected in series to reduce an OFF current value. In this embodiment, the TFT 2402 has a double-gate structure, however, it may have a triple gate structure, or a multi-gate structure having more gates.

A current controlling TFT 2403 is formed by using the n-channel TFT 201 shown in FIG. 8B. At this time, a drain wiring 35 of the switching TFT 2402 is electrically connected to a gate electrode 37 of the current controlling TFT by a wiring 36. Furthermore, a wiring 38 is a gate wiring electrically connected to gate electrodes 39a and 39b of the switching TFT 2402.

At this time, it is very important that the current controlling TFT 2403 has a structure of the present invention. The current controlling TFT functions as an element for controlling the amount of a current flowing through an EL element, so that the current controlling TFT 2403 is likely to be degraded by heat and hot carriers due to a large amount of current flowed therethrough. Therefore, an LDD region overlapping partly with a gate electrode, is provided on the current controlling TFT, thereby preventing the deterioration of TFT and enhancing the stability of the operation.

Furthermore, in this embodiment, the current controlling TFT 2403 has a single gate structure. However, it may have a multi-gate structure in which a plurality of TFTs are connected in series. Furthermore, it may also be possible that a plurality of TFTs are connected in parallel to substantially divide a channel formation region into a plurality of parts, so as to conduct highly efficient heat release. Such a structure is effective for preventing degradation due to heat.

As shown in FIG. 21A, a wiring to be the gate electrode 37 of the current controlling TFT 2403 overlaps a drain wiring 40 of the current controlling TFT 2403 via an insulating film in a region 2404. In the region 2404, a capacitor is formed. The capacitor 2404 functions for holding a voltage applied to a gate of the current controlling TFT 2403. The drain wiring 40 is connected to a current supply line (power source line) 2501 so as to be always supplied with a constant voltage.

A first passivation film 41 is provided on the switching TFT 2402 and the current controlling TFT 2403, and a flattening film 42 that is made of a resin insulating film is formed thereon. It is very important to flatten the step difference due to TFTs by using the flattening film 42. The step difference may cause a light-emitting defect because the EL layer to be formed later is very thin. Thus, it is desirable to flatten the step difference before forming a pixel electrode so that the EL layer is formed on a flat surface.

Reference numeral 43 denotes a pixel electrode (cathode of an EL element) that is made of a conductive film with high reflectivity and is electrically connected to the drain of the current controlling TFT 2403. As the pixel electrode 43, a low resistant conductive film such as an aluminum alloy film, a copper alloy film, and a silver alloy film, or a lamination film thereof can be preferably used. Needless to say, a lamination structure with other conductive films may also be used. A light-emitting layer 44 is formed in a groove (corresponding to a pixel) formed by banks 44a and 44b made of an insulating film (preferably resin). Herein, only one pixel is shown, however, light-emitting layers corresponding to each color R (red), G (green), and B (blue) may be formed. As an organic EL material for the light-emitting layer, a π-conjugate polymer material is used. Examples of the typical polymer material include polyparaphenylene vinylene (PPV), polyvinyl carbazole (PVK), and polyfluorene. There are various types of PPV organic EL materials. For example, materials as described in H. Shenk, Becker, O. Gelsen, E. Kluge, W. Kreuder and H. Spreitzer, "Polymers for Light Emitting Diodes", Euro Display, Proceedings, 1999, pp. 33–37" and Japanese Laid-Open Publication No. 10-92576 can be used.

More specifically, as a light-emitting layer emitting red light, cyanopolyphenylene vinylene may be used. As a light-emitting layer emitting green light, polyphenylene vinylene may be used. As a light-emitting layer emitting blue light, polyphenylene vinylene or polyalkyl phenylene may be used. The film thickness may be prescribed to be 30 to 150 nm (preferably 40 to 100 nm). The above-mentioned organic EL materials are merely examples for use as a light-emitting layer, so that the present invention is not limited thereto. A light-emitting layer, an electric charge transporting layer, or an electric charge injection layer may be appropriately combined to form an EL layer (for light emitting and moving carriers therefore). For example, in this embodiment, the case where a polymer material is used for the light-emitting layer has been described. However, a low molecular-weight organic EL material may be used. Furthermore, an inorganic material such as silicon carbide can also be used for an electric charge transporting layer and an electric charge injection layer. As these organic EL materials and inorganic materials, known materials can be used.

In this embodiment, an EL layer with a lamination structure is used, in which a hole injection layer 46 made of PEDOT (polythiophene) or PAni (polyaniline) is provided on the light-emitting layer 45. An anode 47 made of a transparent conductive film is provided on the hole injection layer 46. In this embodiment, light generated by the light-emitting layer 45 is irradiated to the upper surface (toward the upper of TFTs), so that the anode must be transparent to light. As a transparent conductive film, a compound of indium oxide and tin oxide, and a compound of indium oxide and zinc oxide can be used. The conductive film is formed after forming the light-emitting layer and the hole injection layer with low heat resistance, so that the conductive film that can be formed at a possibly low temperature is preferably used.

When the anode 47 is formed, the EL element 2405 is completed. The EL element 2405 refers to a capacitor composed of the pixel electrode (cathode) 43, the light-emitting layer 45, the hole injection layer 46, and the anode 47. As show in FIG. 22A, the pixel electrode 43 substantially corresponds to the entire area of a pixel. Therefore, the entire pixel functions as an EL element. Thus, a light image display with very high light use efficiency can be performed.

In this embodiment, a second passivation film 48 is further formed on the anode 47. As the second passivation film 48, a silicon nitride film or a silicon nitride oxide film is preferably used. The purpose of the passivation film 48 is to prevent the EL element from being exposed to the outside. That is, the passivation film 48 protects an organic EL material from degradation due to oxidation, and suppresses the release of gas from the organic EL material. Because of this, the reliability of the EL display device is enhanced.

As described above, the EL display panel of the present invention has a pixel portion made of a pixel with a structure as shown in FIG. 21, and includes a switching TFT having a sufficiently low OFF current value and a current controlling TFT that is strong to the injection of hot carriers. Thus, an EL display panel having high reliability and is capable of displaying a satisfactory image, is obtained.

In this embodiment, referring to FIG. 20B, the case will be described where the structure of the EL layer is reversed. The current control TFT 2601 is formed using a p-channel type TFT 200 of FIG. 8B. The manufacturing process is referred to Embodiment 7. In this embodiment, a transparent conductive film is used as a pixel electrode (anode) 50. Specifically, a conductive film made of a compound of indium oxide and zinc oxide is used. Needless to say, a conductive film made of a compound of indium oxide and tin oxide may be used.

After banks 51a and 51b made of an insulating film are formed, a light-emitting layer 52 made of polyvinyl carbazole is formed by coating of a solution. On the light-emitting layer 52, an electron injection layer 53 made of potassium acetyl acetonate (acacK), and a cathode 54 made of an aluminum alloy are formed. In this case, the cathode 54 functions as a passivation film. Thus, an EL element 2602 is formed. In this embodiment, light generated by the light-emitting layer 53 is irradiated toward the substrate on which a TFT is formed as represented by an arrow. In the case of the structure of this embodiment, it is preferable that the current controlling TFT 2601 is formed of a p-channel TFT.

This embodiment can be realized by being appropriately combined with the structures of TFT in Embodiments 6 through 8. Furthermore, it is effective to use the EL display panel of this embodiment as a display portion of electronic equipments of Embodiment 13.

Embodiment 12

In this embodiment, referring to FIG. 22, the case will be described where a pixel having a structure different from that of the circuit diagram shown in FIG. 21B is used. Reference numeral 2701 denotes a source wiring of a switching TFT 2702, 2703 denotes a gate wiring of the switching TFT 2702, 2704 denotes a current controlling TFT, 2705 denotes a capacitor, 2706 and 2708 denote current supply lines, and 2707 denotes an EL element.

Figure 22A:
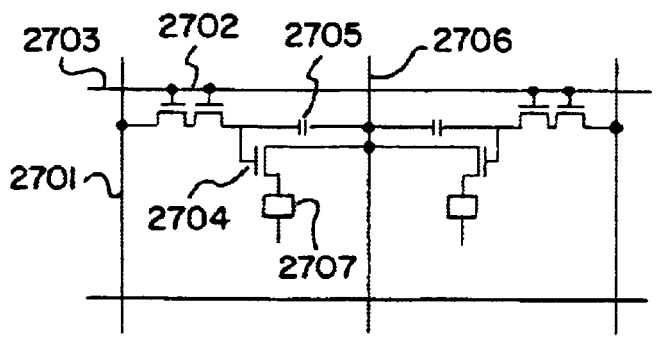
FIGS. 22A to 22C are examples of a circuit diagram for a pixel portion of an EL display device.

FIG. 22A shows the case where two pixels share the current supply line 2706. More specifically, two pixels are formed so as to be axisymmetric with respect to the current supply line 2706. In this case, the number of power supply lines can be reduced, so that the pixel portion is allowed to have a higher definition.

Figure 22B:
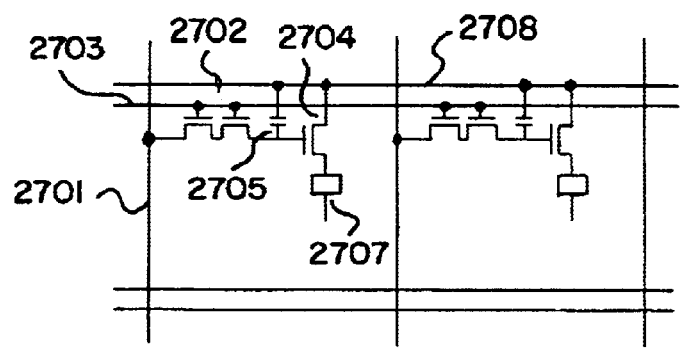

Furthermore, FIG. 22B shows the case where the current supply line 2708 and the gate wiring 2703 are provided in parallel. In FIG. 22B, although the current supply line 2708 does not overlap the gate wiring 2703, if both lines are formed on different layers, they can be provided so as to overlap each other via an insulating film. In this case, the current supply line 2708 and the gate wiring 2703 can share an occupied area, so that a pixel portion is allowed to have higher definition.

Figure 22C:
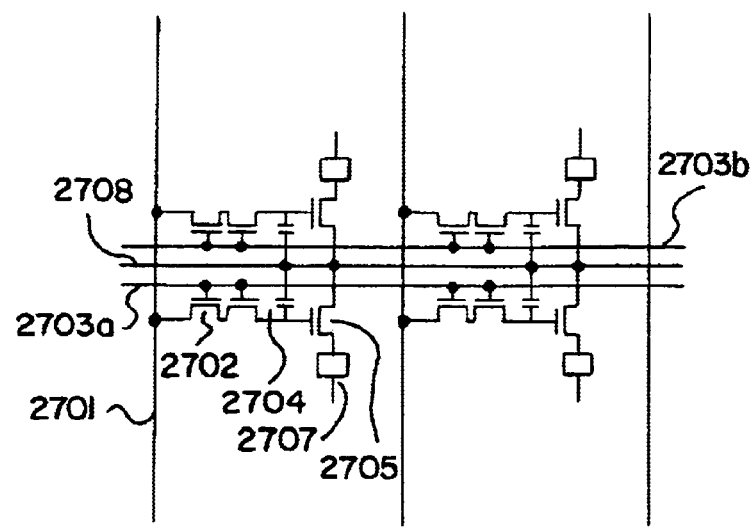

Furthermore, FIG. 22C shows the case where the current supply line 2708 and gate wiring 2703 are provided in parallel in the same way as in FIG. 22B, and two pixels are formed so as to be axisymmetric with respect to the current supply line 2708. It is also effective to provide the current supply line 2708 so as to overlap one of the gate wirings 2703. In this case, the number of the power supply lines can be reduced, so that a pixel portion is allowed to have higher definition. In FIGS. 22A and 22B, the capacitor 2404 is provided so as to hold a voltage applied to a gate of the current controlling TFT 2403. However, the capacitor 2404 can be omitted.

Since the n-channel TFT according to the present invention as shown in FIG. 20A is used as the current controlling TFT 2403, the current controlling TFT 2403 has an LDD region provided so as to overlap a gate electrode via a gate insulating film. In this overlapping region, a parasitic capacitor called as a gate capacitor is generally formed. This embodiment is characterized in that the parasitic capacitor is actively used in place of the capacitor 2404. The capacitance of the parasitic capacitor is varied depending upon the area in which the above-mentioned gate electrode overlaps the LDD region. Therefore, the capacitance is determined by the length of the LDD region included in the overlapping region. Similarly, in the structure shown in FIGS. 22A, 22B, and 22C, the capacitor 2705 can also be omitted.

This embodiment can be realized by being appropriately combined with the structures of TFT in Embodiments 1 through 8. Furthermore, it is effective to use an EL display panel of this embodiment as a display portion of electronic equipment of Embodiment 13.

Embodiment 13

CMOS circuits and pixel portions formed in accordance with the present invention can be used in various electro-optical devices (active matrix type liquid crystal display, active matrix type EC display). In other words, the present invention can be applied to all of the electronic equipments having these electro-optical devices as the display section.

The following can be given as examples of the electronic equipment: video cameras; digital cameras; projectors (rear type or front type); head mounted displays (goggle type display); car navigation systems; car stereo; personal computers; portable information terminals (such as mobile computers, portable telephones and electronic notebook). An example of these is shown in FIGS. 23, 24 and 25.

Figure 23A:
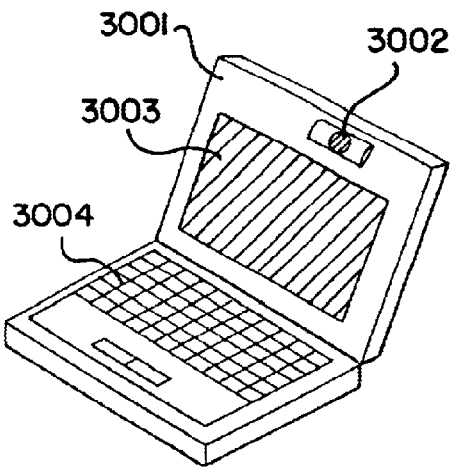
FIGS. 23A to 23F are diagrams showing examples of a semiconductor device.

FIG. 23A shows a personal computer, and it includes a main body 3001, an image input section 3002, a display portion 3003, and a keyboard 3004. The present invention is applicable to the image input section 3002, the display portion 3003, and other signal controlling circuits.

Figure 23B:
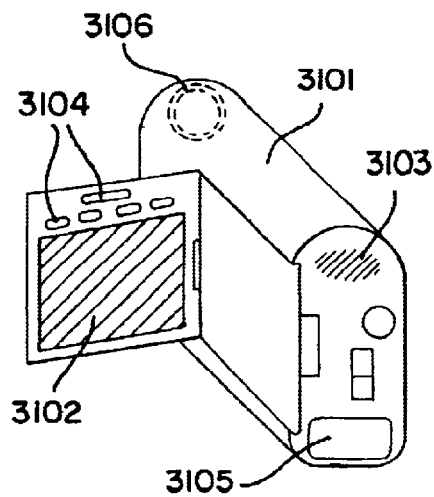

FIG. 23B shows a video camera, and it includes a main body 3101, a display portion 3102, a voice input section 3103, operation switches 3104, a battery 3105, and an image receiving section 3106. The present invention is applicable to the display portion 3102 and other signal controlling circuits.

Figure 23C:
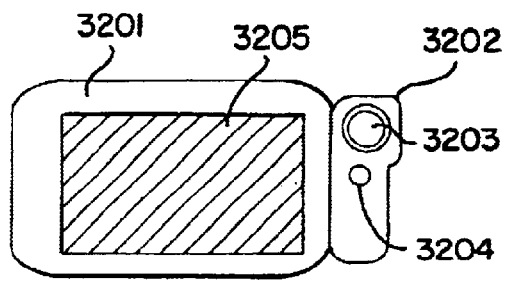

FIG. 23C shows a mobile computer, and it includes a main body 3201, a camera section 3202, an image receiving section 3203, operation switches 3204, and a display portion 3205. The present invention is applicable to the display portion 3205 and other signal controlling circuits.

Figure 23D:
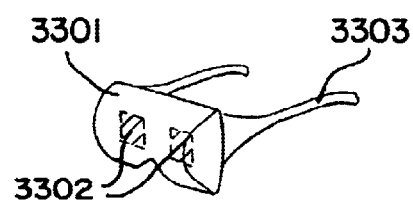

FIG. 23D shows a goggle type display, and it includes a main body 3301; a display portion 3302; and an arm section 3303. The present invention is applicable to the display portion 3302 and other signal controlling circuits.

Figure 23E:
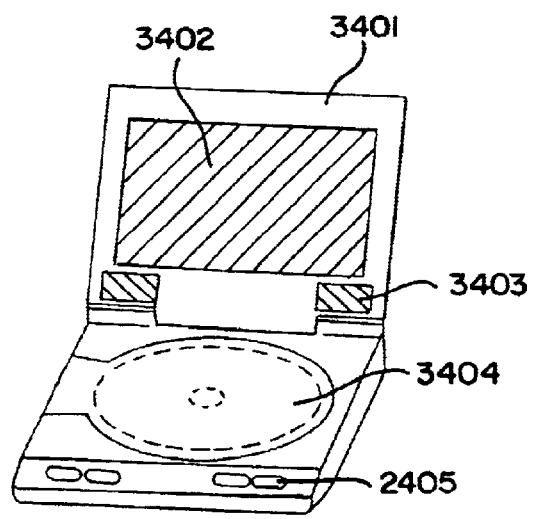

FIG. 23E shows a player using a recording medium which records a program (hereinafter referred to as a recording medium), and it includes a main body 3401; a display portion 3402; a speaker section 3403; a recording medium 3404; and operation switches 3405. This player uses DVD (digital versatile disc), CD, etc. for the recording medium, and can be used for music appreciation, film appreciation, games and Internet. The present invention is applicable to the display portion 3402 and other signal controlling circuits.

Figure 23F:
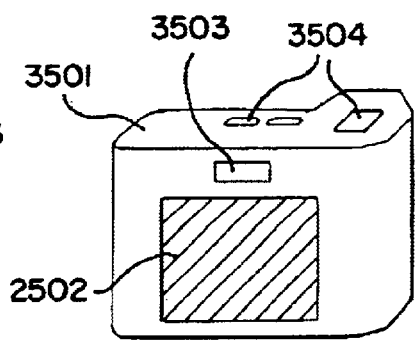

FIG. 23F shows a digital camera, and it includes a main body 3501; a display portion 3502; a view finder 3503; operation switches 3504; and an image receiving section (not shown in the figure). The present invention can be applied to the display portion 3502 and other signal controlling circuits.

Figure 24A:
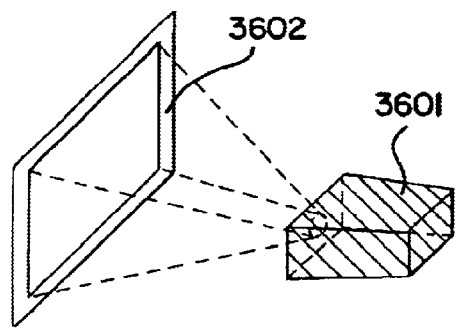
FIGS. 24A to 24D are diagrams showing examples of a semiconductor device.

FIG. 24A is a front-type projector, and it includes a projection device 3601 and a screen 3602. The present invention is applicable to a liquid crystal display device 3808 which comprises one of the projection device 3601 and other signal controlling circuits.

Figure 24B:
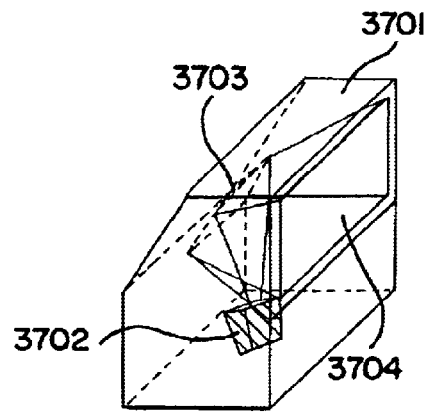

FIG. 24B is a rear-type projector, and it includes a main body 3701, a projection device 3702, a mirror 3703, and a screen 3704. The present invention is applicable to a liquid crystal display device 3808 which comprises one of the projection device 3702 and other signal controlling circuits.

Figure 24C:
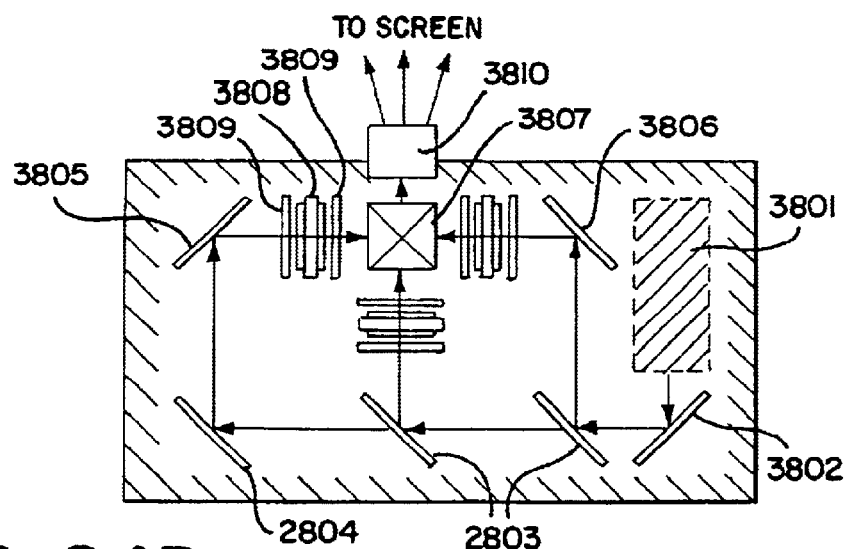

FIG. 24C is a diagram showing an example of the structure of the projection devices 3601, 3702 in FIGS. 24(A) and 24(B). The projection device 3601 or 3702 comprises a light source optical system 3801, mirrors 3802, 3804 to 3806, dichroic mirrors 3803, a prism 3807, liquid crystal display devices 3808, phase difference plates 3809, and a projection optical system 3810. The projection optical system 3810 is composed of an optical system including a projection lens. This example shows an example of three plate type but not particularly limited thereto. For instance, the invention may be applied also to a single plate type optical system. Further, in the light path indicated by an arrow in FIG. 24C, an optical system such as an optical lens, a film having a polarization function, a film for adjusting a phase difference, and an IR film may be suitably provided by a person who carries out the invention.

Figure 24D:
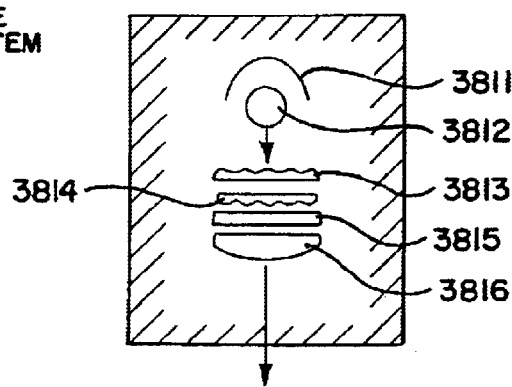

FIG. 24D is a diagram showing an example of the structure of the light source optical system 3801 in FIG. 24C. In this embodiment, the light source optical system 3801 comprises a reflector 3811, a light source 3812, lens arrays 3813, 3814, a polarization conversion element 3815, and a condenser lens 3816. The light source optical system shown in FIG. 24D is merely an example, and is not particularly limited to the illustrated structure. For example, a person who carries out the invention is allowed to suitably add to the light source optical system an optical system such as an optical lens, a film having a polarization function, a film for adjusting a phase difference, and an IR film.

Note that a transmission electro-optical device is used as the projector shown in FIG. 24, a reflection type electro-optical device is not illustrated.

Figure 25A:
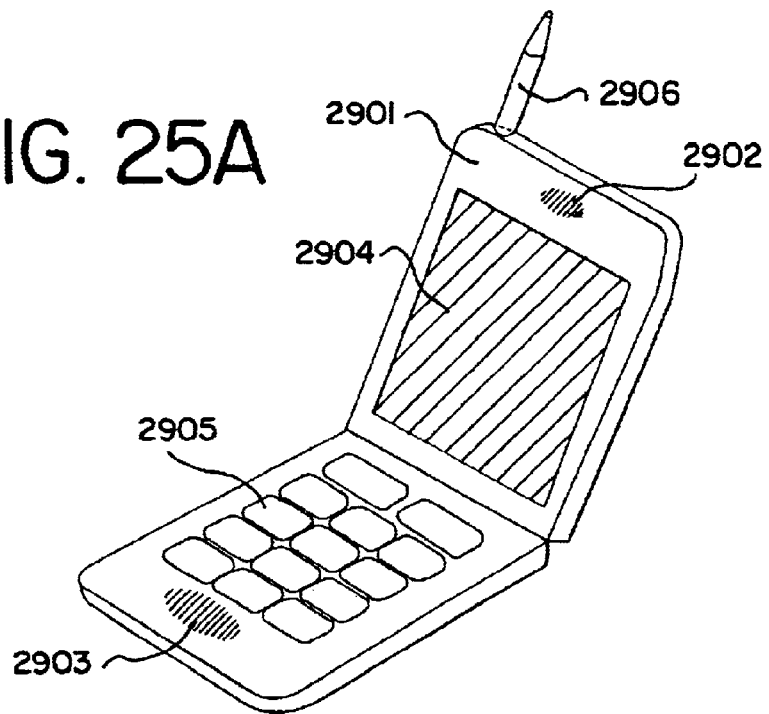
FIGS. 25A to 25C are diagrams showing examples of a semiconductor device.

FIG. 25A is a portable telephone, and it includes a main body 3901, an audio output section 3902, an audio input section 3903, a display portion 3904, operation switches 3905, and an antenna 3906. The present invention can be applied to the audio output portion 3902, the audio input portion 3903, the display portion 3904

Figure 25B:
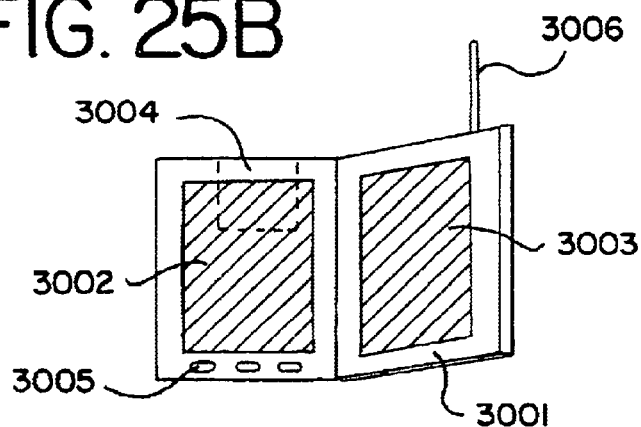

FIG. 25B is a portable book (electronic book), and it includes a main body 4001, display portions 4002 and 4003, a recording medium 4004, operation switches 4005, and an antenna 4006. The present invention can be applied to the display portions 4002 and 4003, and other signal circuit.

Figure 25C:
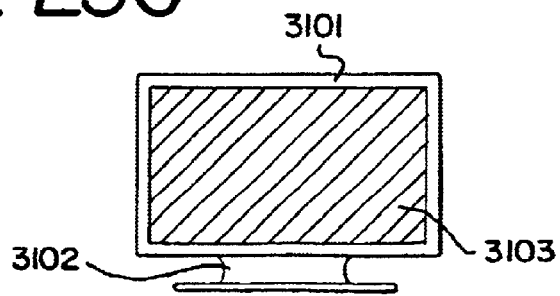
Figure 26A:
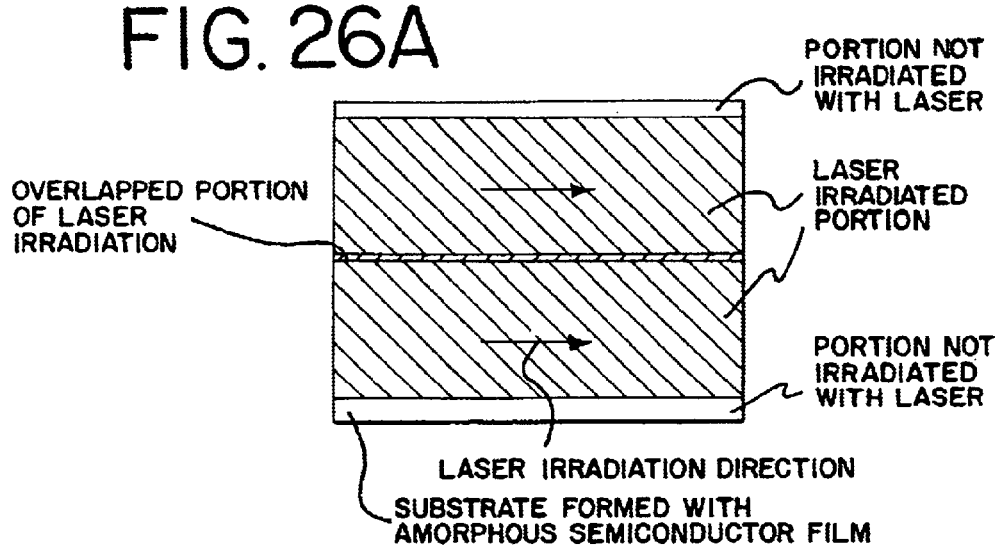
FIGS. 26A to 26C are diagrams showing examples of a method of irradiating a large-area substrate with a linear laser beam.
Figure 26B:
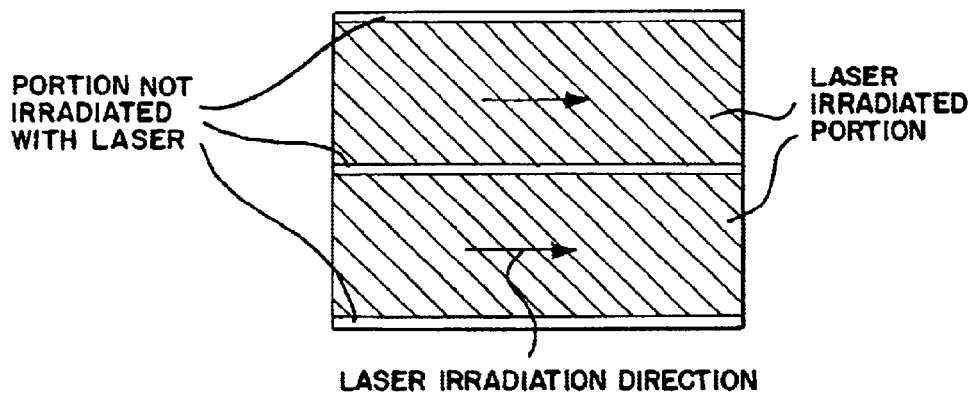
Figure 26C:
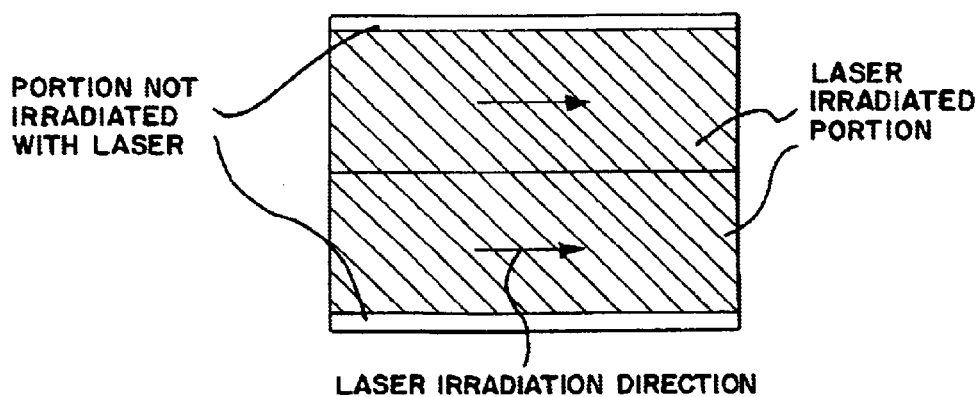

FIG. 25C is a display, and it includes a main body 4101, a support stand 4102, and a display portion 4103. The present invention can be applied to the display portion 4103. The display of the present invention is advantageous for a large size screen in particular, and is advantageous for a display equal to or greater than 10 inches (especially equal to or greater than 30 inches) in diagonal.

The applicable range of the present invention is thus extremely wide, and it is possible to apply the present invention to electronic equipment in all fields. Further, the electronic equipment of the embodiment 13 can be realized by using a constitution of any combination of the embodiments 1 to 12.

Adopting the structure of the present invention can provide the following basic utilities.

(a) An amorphous semiconductor film can be crystallized, or a partially crystallized semiconductor film can be improved in its crystallinity, by subjecting the film to laser annealing using laser emitters of different wavelengths.

(b) When the crystalline semiconductor film obtained in (a) is used to form a TFT, an electric characteristic of the TFT can be improved.

What is claimed is:

1. A method of manufacturing a semiconductor device, comprising:
    forming an amorphous semiconductor film over a substrate;
    irradiating the amorphous semiconductor film with a first laser beam to form a first crystalline semiconductor film; and
    irradiating the first crystalline semiconductor film with a second laser beam to form a second crystalline semiconductor film,
    wherein the first laser beam is a third harmonic of a first YAG laser, and
    wherein the second laser beam is a second harmonic of a second YAG laser.

2. A method according to claim 1, wherein the first laser beam and the second laser beam are different in wavelength from each other.

3. A method of manufacturing a semiconductor device, comprising:
    forming an amorphous semiconductor film over a substrate;
    irradiating the amorphous semiconductor film with a first laser beam to form a first crystalline semiconductor film; and
    irradiating the first crystalline semiconductor film with a second laser beam to form a second crystalline semiconductor film,
    wherein the first laser beam is a $YVO_4$ laser, and
    wherein the second laser beam is a YAG laser.

4. A method of manufacturing a semiconductor device, comprising:
    forming an amorphous semiconductor film over a substrate;
    irradiating the amorphous semiconductor film with a first laser beam to form a first crystalline semiconductor film; and
    irradiating the first crystalline semiconductor film with a second laser beam to form a second crystalline semiconductor film, wherein
    the second laser beam is 370 to 650 nm in wavelength, and
    wherein the first laser beam is a $YVO_4$ laser.

5. A method of manufacturing a semiconductor device, comprising the steps of:
    forming an amorphous semiconductor film over a substrate;
    irradiating the amorphous semiconductor film with a first laser beam to form a first crystalline semiconductor film; and
    irradiating the first crystalline semiconductor film with a second laser beam to form a second crystalline semiconductor film, wherein
        the first laser beam is 126 to 370 nm in wavelength whereas the second laser beam is 370 to 650 nm in wavelength.

6. A method according to claim 1, wherein the semiconductor device is incorporated into a device selected from the group consisting of a liquid crystal display device and a light emitting device.

7. A method according to claim 1, wherein the semiconductor device is incorporated into a device selected from the group consisting of a cellular phone, a video camera, a digital camera, a projector, a goggle type display, a personal computer, a DVD player, an electronic book, and a portable information terminal.

8. A method according to claim 3, wherein the semiconductor device is incorporated into a device selected from the group consisting of a liquid crystal display device and a light emitting device.

9. A method according to claim 3, wherein the semiconductor device is incorporated into a device selected from the group consisting of a cellular phone, a video camera, a digital camera, a projector, a goggle type display, a personal computer, a DVD player, an electronic book, and a portable information terminal.

10. A method according to claim 4, wherein the semiconductor device is incorporated into a device selected from the group consisting of a liquid crystal display device and a light emitting device.

11. A method according to claim 4, wherein the semiconductor device is incorporated into a device selected from the group consisting of a cellular phone, a video camera, a digital camera, a projector, a goggle type display, a personal computer, a DVD player, an electronic book, and a portable information terminal.

12. A method according to claim 5, wherein the semiconductor device is incorporated into a device selected from the group consisting of a liquid crystal display device and a light emitting device.

13. A method according to claim 5, wherein the semiconductor device is incorporated into a device selected from the group consisting of a cellular phone, a video camera, a digital camera, a projector, a goggle type display, a personal computer, a DVD player, an electronic book, and a portable information terminal.

14. A method of manufacturing a semiconductor device, comprising:
    forming an amorphous semiconductor film over a substrate;
    heating the amorphous semiconductor film to form a first crystalline semiconductor film;
    irradiating the first crystalline semiconductor film with a first laser beam to form a second crystalline semiconductor film; and
    irradiating the second crystalline semiconductor film with a second laser beam to form a third crystalline semiconductor film,
    wherein the first laser beam is a third harmonic of a first YAG laser, and
    wherein the second laser beam is a second harmonic of a second YAG laser.

15. A method according to claim 14, wherein the first laser beam and the second laser beam are different in wavelength from each other.

16. A method of manufacturing a semiconductor device, comprising:
    forming an amorphous semiconductor film over a substrate;
    heating the amorphous semiconductor film to form a first crystalline semiconductor film;
    irradiating the first crystalline semiconductor film with a first laser beam to form a second crystalline semiconductor film; and irradiating the second crystalline semiconductor film with a second laser beam to form a third crystalline semiconductor film, wherein the first laser beam is a $YVO_4$ laser, and wherein the second laser beam is a YAG laser.

17. A method of manufacturing a semiconductor device, comprising:

forming an amorphous semiconductor film over a substrate;

heating the amorphous semiconductor film to form a first crystalline semiconductor film;

irradiating the first crystalline semiconductor film with a first laser beam to form a second crystalline semiconductor film; and irradiating the second crystalline semiconductor film with a second laser beam to form a third crystalline semiconductor film, wherein the second laser beam is 370 to 650 nm in wavelength, and wherein the first laser beam is a $YVO_4$ laser.

18. A method of manufacturing a semiconductor device, comprising the steps of:

forming an amorphous semiconductor film over a substrate;

heating the amorphous semiconductor film to form a first crystalline semiconductor film;

irradiating the first crystalline semiconductor film with a first laser beam to form a second crystalline semiconductor film; and irradiating the second crystalline semiconductor film with a second laser beam to form a third crystalline semiconductor film, wherein the first laser beam is a 126 to 370 nm in wavelength whereas the second laser beam is 370 to 650 nm in wavelength.

19. A method according to claim 14, wherein the semiconductor device is incorporated into a device selected from the group consisting of a liquid crystal display device and a light emitting device.

20. A method according to claim 14, wherein the semiconductor device is incorporated into a device selected from the group consisting of a cellular phone, a video camera, a digital camera, a projector, a goggle type display, a personal computer, a DVD player, an electronic book, and a portable information terminal.

21. A method according to claim 16, wherein the semiconductor device is incorporated into a device selected from the group consisting of a liquid crystal display device and a light emitting device.

22. A method according to claim 16, wherein the semiconductor device is incorporated into a device selected from the group consisting of a cellular phone, a video camera, a digital camera, a projector, a goggle type display, a personal computer, a DVD player, an electronic book, and a portable information terminal.

23. A method according to claim 17, wherein the semiconductor device is incorporated into a device selected from the group consisting of a liquid crystal display device and a light emitting device.

24. A method according to claim 17, wherein the semiconductor device is incorporated into a device selected from the group consisting of a cellular phone, a video camera, a digital camera, a projector, a goggle type display, a personal computer, a DVD player, an electronic book, and a portable information terminal.

25. A method according to claim 18, wherein the semiconductor device is incorporated into a device selected from the group consisting of a liquid crystal display device and a light emitting device.

26. A method according to claim 18, wherein the semiconductor device is incorporated into a device selected from the group consisting of a cellular phone, a video camera, a digital camera, a projector, a goggle type display, a personal computer, a DVD player, an electronic book, and a portable information terminal.

* * * * *